United States Patent
Koizumi et al.

(10) Patent No.: US 9,159,648 B2
(45) Date of Patent: Oct. 13, 2015

(54) WIRING SUBSTRATE AND MANUFACTURING METHOD THEREOF

(71) Applicant: SHINKO ELECTRIC INDUSTRIES CO., LTD., Nagano-shi, Nagano (JP)

(72) Inventors: Naoyuki Koizumi, Nagano (JP); Jun Furuichi, Nagano (JP); Yasuyoshi Horikawa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 7 days.

(21) Appl. No.: 13/939,442

(22) Filed: Jul. 11, 2013

(65) Prior Publication Data

US 2014/0015121 A1    Jan. 16, 2014

(30) Foreign Application Priority Data

Jul. 13, 2012    (JP) .................................. 2012-157907

(51) Int. Cl.
| | |
|---|---|
| H01L 23/48 | (2006.01) |
| H01L 21/48 | (2006.01) |
| H05K 1/02 | (2006.01) |
| H05K 3/46 | (2006.01) |
| H01L 23/13 | (2006.01) |
| H01L 23/15 | (2006.01) |
| H01L 23/00 | (2006.01) |
| H05K 3/00 | (2006.01) |
| H01L 23/498 | (2006.01) |

(52) U.S. Cl.
CPC .............. *H01L 23/48* (2013.01); *H01L 21/486* (2013.01); *H01L 23/13* (2013.01); *H01L 23/15* (2013.01); *H01L 23/49827* (2013.01); *H05K 1/0271* (2013.01); *H05K 3/4605* (2013.01); *H01L 23/49822* (2013.01); *H01L 24/81* (2013.01); *H01L 2224/131* (2013.01); *H01L 2224/16237* (2013.01); *H01L 2224/32225* (2013.01); *H01L 2224/73204* (2013.01); *H01L 2224/81192* (2013.01); *H01L 2924/15311* (2013.01); *H05K 3/0047* (2013.01); *H05K 3/0052* (2013.01); *H05K 2201/0187* (2013.01); *H05K 2201/068* (2013.01)

(58) Field of Classification Search
CPC ........... H01L 2924/01029; H01L 2924/01079; H01L 2924/01013; H01L 2924/14; H01L 2924/01078
USPC ........................................................ 257/734
See application file for complete search history.

(56) References Cited

U.S. PATENT DOCUMENTS

| | | | |
|---|---|---|---|
| 6,504,240 B2 * | 1/2003 | Ikegami ......................... | 257/678 |
| 2011/0024170 A1 * | 2/2011 | Nagasawa ...................... | 174/258 |
| 2011/0193203 A1 * | 8/2011 | Goto et al. ...................... | 257/659 |

FOREIGN PATENT DOCUMENTS

JP    2005-086071    3/2005

* cited by examiner

*Primary Examiner* — Lex Malsawma
*Assistant Examiner* — Long Le
(74) *Attorney, Agent, or Firm* — Rankin, Hill & Clark LLP

(57) ABSTRACT

A wiring substrate includes: a core substrate made of glass and having: a first surface; a second surface opposite to the first surface; and a side surface between the first surface and the second surface; and an insulating layer and a wiring layer, which are formed on at least one of the first surface and the second surface of the core substrate. A plurality of concave portions are formed in the side surface of the core substrate to extend from the first surface to the second surface, and a resin is filled in the respective concave portions.

16 Claims, 23 Drawing Sheets

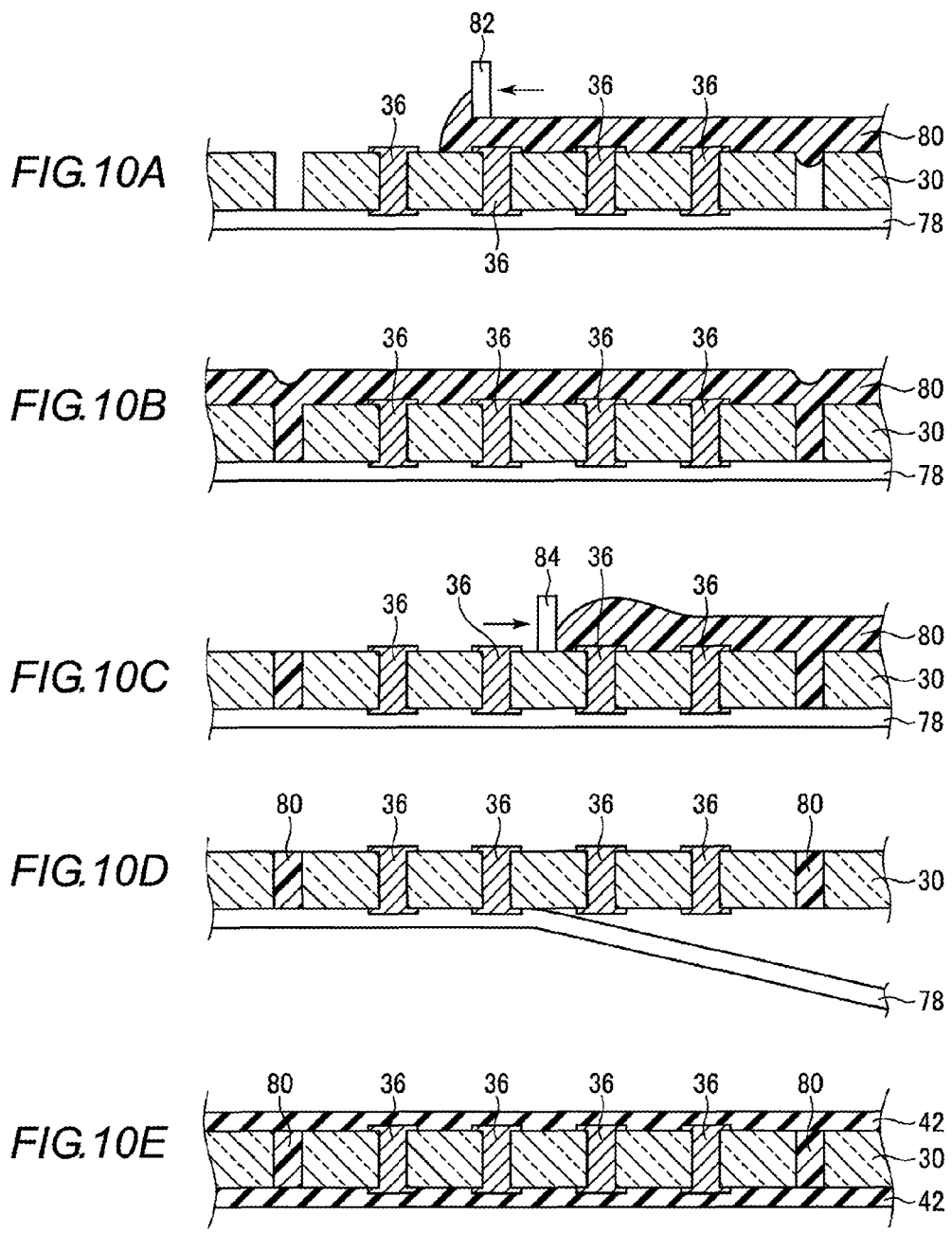

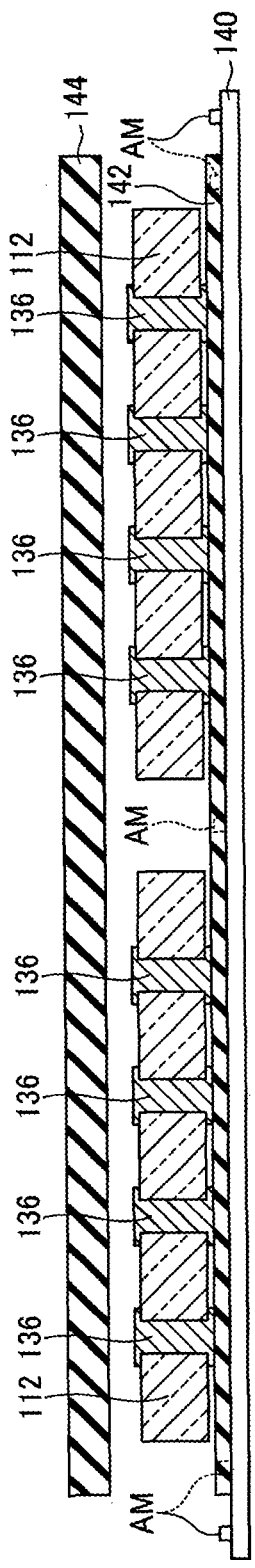
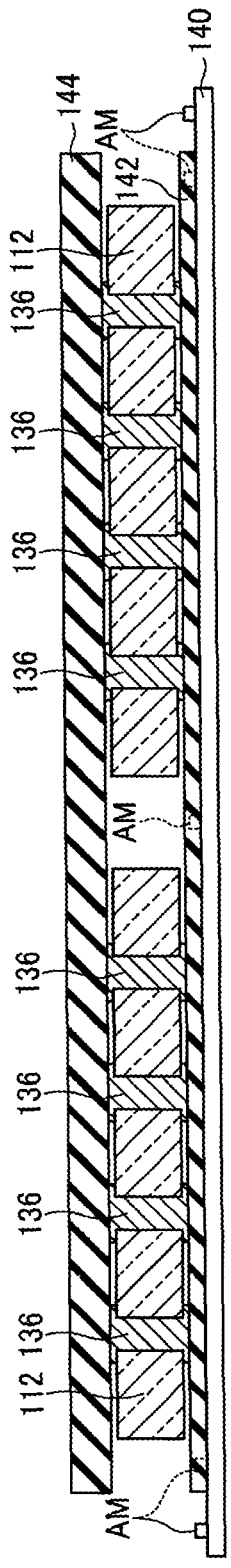
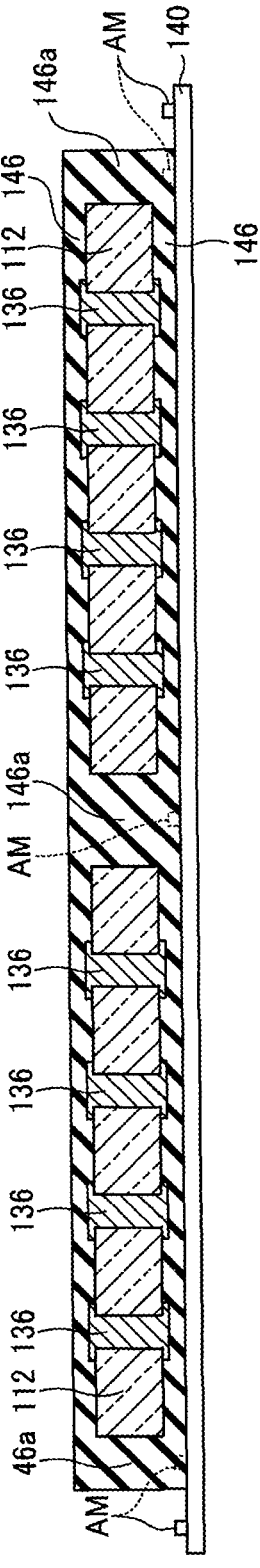

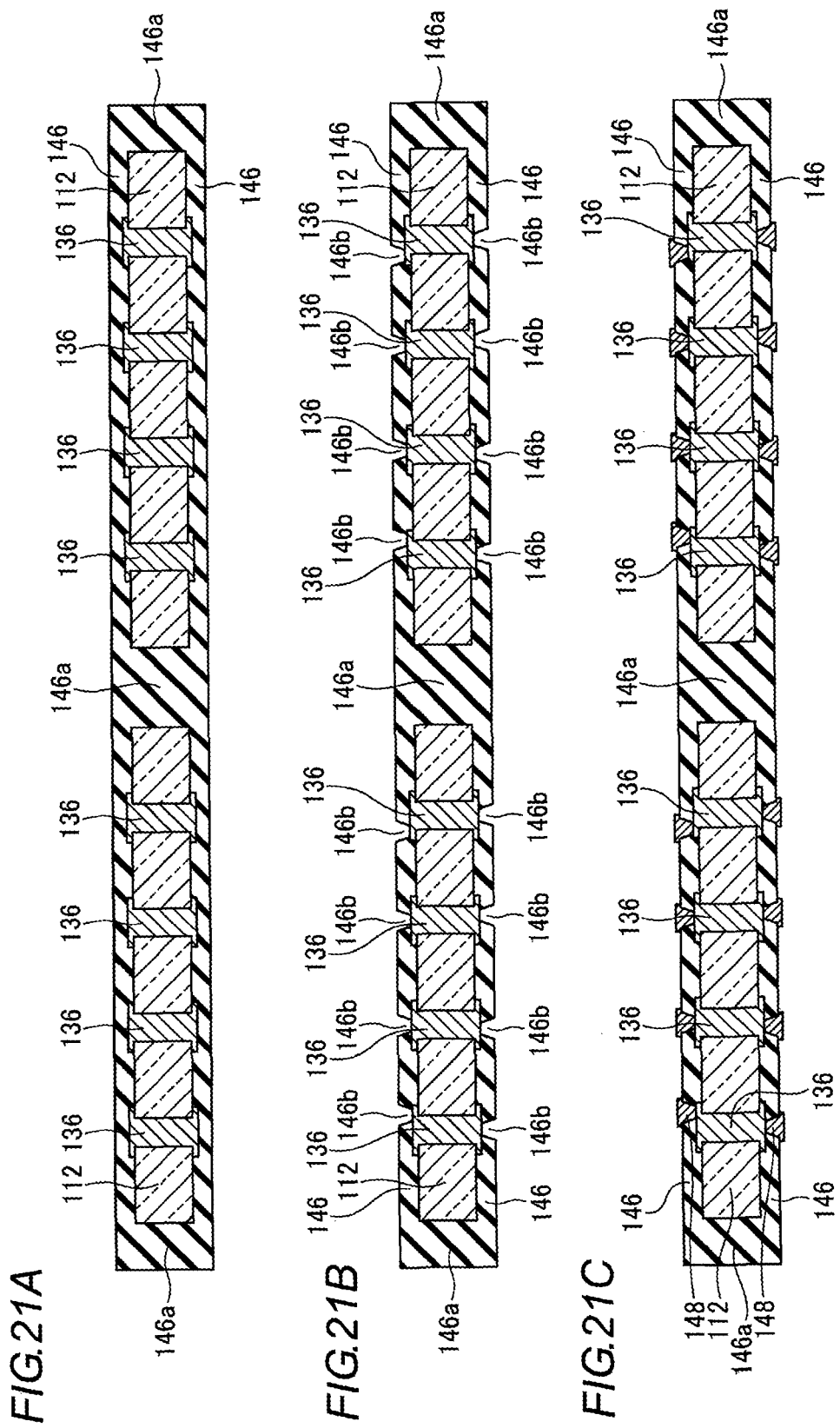

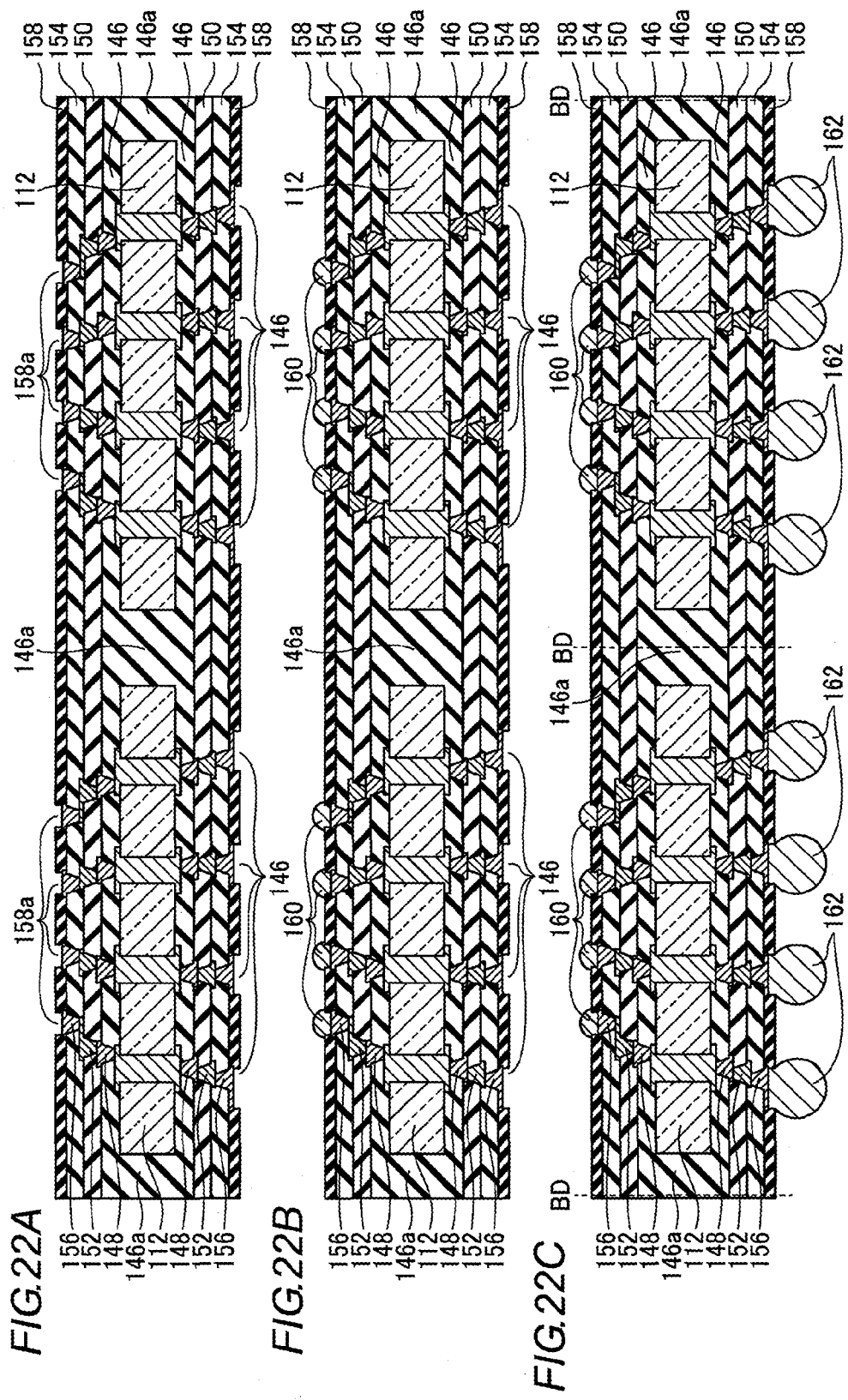

WIRING SUBSTRATE AND MANUFACTURING METHOD THEREOF

This application claims priority from Japanese Patent Application No. 2012-157907, filed on Jul. 13, 2012, the entire contents of which are herein incorporated by reference.

BACKGROUND

1. Technical Field

The present disclosure relates to a wiring substrate and a manufacturing method thereof.

2. Description of the Related Art

In the related art, a wiring substrate for mounting an electronic component such as a semiconductor chip has been known. In the wiring substrate, a plurality of interlayer insulating layers and wires are formed on one surface or both surfaces of a core substrate.

As a material of the core substrate, an organic base material, a ceramic base material, a silicon base material, a glass base material, or the like may be used. In consideration of a thermal expansion coefficient or insulation properties, it is preferable that ceramic or glass be used (see e.g., JP-A-2005-86071).

In the related art, it is suggested that glass is used as the material of the core substrate. However, commercialization of a wiring substrate is not realized which satisfies conditions of an actual product in terms of durability, production yield, productivity, or the like.

SUMMARY OF THE INVENTION

It is an object of the present invention to provide a wiring substrate capable of satisfying various conditions as a product in terms of durability, production yield, productivity, or the like, and a manufacturing method thereof.

According to one or more aspects of the present invention, there is provided a wiring substrate. The wiring substrate comprises: a core substrate made of glass and comprising: a first surface; a second surface opposite to the first surface; and a side surface between the first surface and the second surface; and an insulating layer and a wiring layer, which are formed on at least one of the first surface and the second surface of the core substrate. A plurality of concave portions are formed in the side surface of the core substrate to extend from the first surface to the second surface, and a resin is filled in the respective concave portions.

According to one or more aspects of the present invention, there is provided a wiring substrate. The wiring substrate comprises: a core substrate made of glass and comprising a first surface; a second surface opposite to the first surface; and a side surface between the first surface and the second surface; and an insulating layer and a wiring layer, which are formed on at least one of the first surface and the second surface of the core substrate. The side surface of the core substrate is entirely covered with a resin.

BRIEF DESCRIPTION OF THE DRAWINGS

FIGS. 10A to 10E are process cross-sectional views showing a third modification example of the resin filling process in the manufacturing method of the wiring substrate according to the first embodiment;

FIGS. 20A to 20C are process cross-sectional views showing the manufacturing method of the wiring substrate according to the second embodiment;

FIGS. 21A to 21C are process cross-sectional views showing the manufacturing method of the wiring substrate according to the second embodiment;

FIGS. 22A to 22C are process cross-sectional views showing the manufacturing method of the wiring substrate according to the second embodiment.

DETAILED DESCRIPTION

Figure 1A:
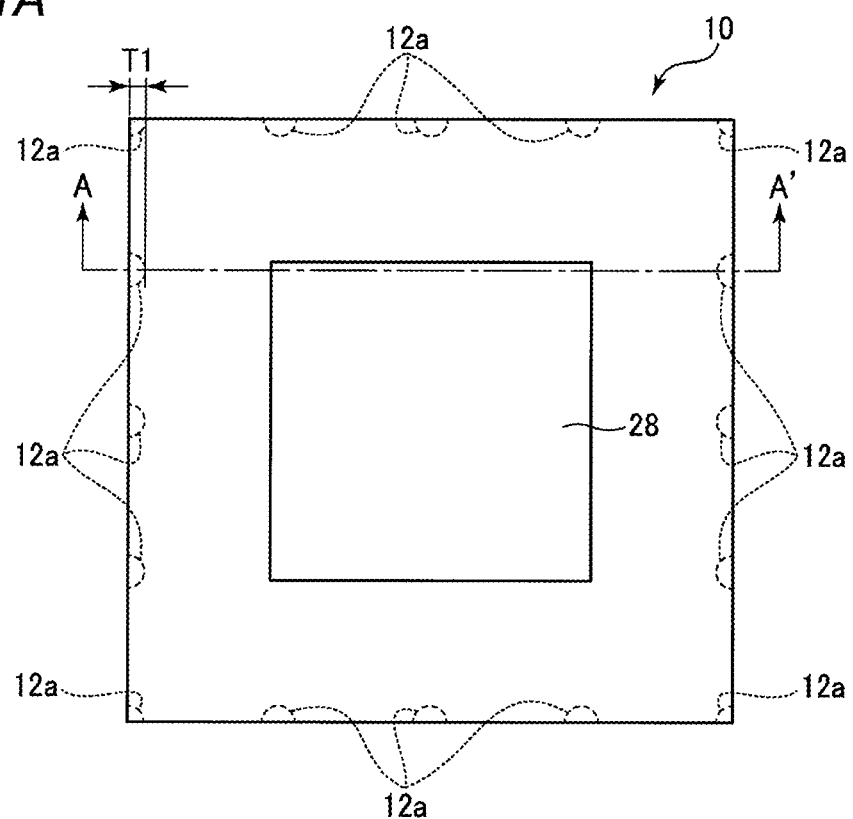
FIGS. 1A and 1B are views showing a wiring substrate according to a first embodiment.

Hereinafter, exemplary embodiments of the present invention will be now described with reference to the drawings. In each drawing, the same reference numeral is attached to the same component, and the overlapped descriptions may be omitted.

First Embodiment (Wiring Substrate)

A wiring substrate according to a first embodiment will be described with reference to FIGS. 1A and 1B. FIG. 1A is a plan view in a state where a semiconductor chip is mounted on the wiring substrate according to the present embodiment, and FIG. 1B is a cross-sectional view taken along line A-A' in the plan view of FIG. 1A.

Figure 1B:
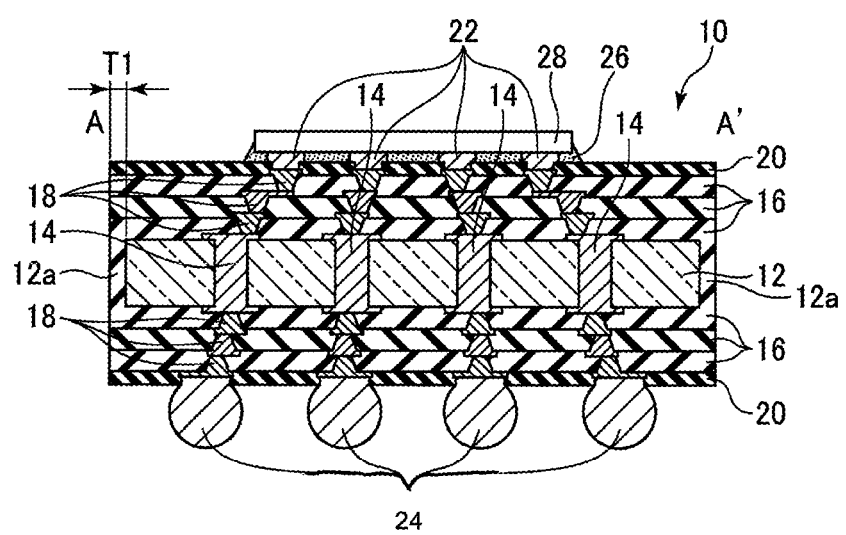

As shown in FIG. 1B, the wiring substrate 10 of the present embodiment includes a core substrate 12 which is formed of glass. For example, the core substrate 12 has a thickness of approximately 200 µm. It is preferable that the thickness of the core substrate 12 be approximately 50 µm to 1000 µm.

As the glass which forms the core substrate 12, soda glass, quartz glass, borosilicate glass, alkali-free glass, photosensitive glass, or crystalline glass may be used.

A plurality of through-electrodes 14 are formed on the core substrate 12. For example, the through-electrode 14 has a diameter of approximately 50 µm, and is formed of copper.

Insulating layers 16 and wiring layers 18 are alternately formed on both upper and lower surfaces of the core substrate 12. For example, the insulating layer 16 has a thickness of approximately 20 µm, and may use a thermosetting epoxy resin, a polyimide resin, an acrylic resin, Teflon (registered trademark) based resin, or the like.

For example, the wiring layers 18 are formed on the insulating layers 16, in which openings for connection are formed, by plating copper.

The insulating layers 16 and the wiring layers 18 of the outermost layers of both upper and lower surfaces of the core substrate 12 are coated with solder resist layers 20. Openings which reach the wiring layers 18 are formed in the solder resist layers 20. For example, the solder resist layer 20 has a thickness of approximately 20 µm.

In the wiring substrate 10 of the present embodiment, a semiconductor chip 28 is mounted on the upper side surface, and the wiring substrate 10 is mounted on another substrate (not shown) through the lower side surface.

Bumps (connection terminals) 22 for connecting the semiconductor chip are formed on the openings of the solder resist layer 20 of the upper side surface of the wiring substrate 10. Bumps (connection terminals) 24 for connecting another substrate (not shown) are formed on the openings of the solder resist layer 20 of the lower side surface of the wiring substrate 10. For example, the bumps (connection terminals) 22 and the bumps (connection terminals) 24 are formed of solder.

The semiconductor chip 28 is mounted on the upper side surface of the wiring substrate 10, and is electrically connected to the wiring substrate 10 by bumps (connection terminals) 22. An under-fill resin 26 is filled between the wiring substrate 10 and the semiconductor chip 28.

As shown in FIG. 1A, in the wiring substrate 10 of the present embodiment, side surfaces of the core substrate 12 formed of glass are partially covered with resins 12a. Side surfaces of four corners and side surfaces of three locations for each side between the corners in the core substrate 12 are covered with the resins 12a.

Three concave portions, which penetrate from the front surface of the core substrate 12 to the rear surface, are formed on side surfaces of each side of the core substrate 12, and the resins 12a are filled into each concave portion. In addition, concave portions, which penetrate from the front surface of the core substrate 12 to the rear surface, are formed on each corner of the core substrate 12, and the resins 12a are filled into each concave portion.

As shown in FIG. 1A, in each side of the core substrate 12, the side surfaces of the resins 12a are flush with the side surfaces of portions which are not covered with the resins 12a.

Moreover, as shown in FIG. 1B, the side surfaces of the wiring substrate 10, the side surfaces of the core substrate 12, and the side surfaces of the resins 12a are flush with one another.

For example, a thickness T1 of the thickest portion of the resin 12a in an in-plane direction of the core substrate 12 is 100 µm. It is preferable that the thickness T1 be approximately 20 µm to 200 µm.

As the resins 12a which partially cover the side surfaces of the core substrate 12, a thermosetting epoxy resin, a polyimide resin, an acrylic resin, Teflon (registered trademark) based resin, or the like may be used.

In the wiring substrate 10 of the present embodiment, the reason why the side surfaces of the core substrate 12 are partially covered with the resins 12a will be now described.

A thermal expansion coefficient of glass is approximate to that of the semiconductor chip mounted on the wiring substrate 12, and the glass has high insulation properties. If glass is used for the core substrate, the thermal expansion coefficient of the entire wiring substrate 12 can be approximate to the thermal expansion coefficient of the semiconductor chip, and stress applied to the semiconductor chip mounted on the wiring substrate 12 can be relaxed. In this way, in terms of the thermal expansion coefficient or the insulation properties, it is preferable that glass be used as the material of the core substrate.

Therefore, the inventors experimentally prepared the wiring substrate using the core substrate formed of glass, and the following problems were found.

First, in order to manufacture a plurality of wiring substrates at one time, a glass substrate having an area of a plurality of core substrates was prepared. A plurality of core substrate areas which became the core substrate were provided on the glass substrate. Boundaries were set between core substrate areas when the glass substrate was separated into respective core substrates. The boundary was a linear shape having a width of an approximately cut width of a cutting device, and was set to a lattice shape on the glass substrate.

Subsequently, insulating layers and wiring layers were formed on both surfaces of the plurality of core substrate areas of the glass substrate. Solder resist layers were coated on the outermost insulating layer and wiring layer.

Subsequently, the glass substrate was cut along boundaries by a cutting device, the plurality of core substrate areas were separated, and the wiring substrate was prepared in which insulating layers and wiring layers were formed on both surfaces of the core substrate formed of glass.

Subsequently, a temperature cycling test for investigating durability as a product was performed with each wiring substrate.

In this way, the wiring substrate was prepared and the test was performed. Then, when the wiring substrate was cut by the cutting device or when the temperature cycling test was performed to the wiring substrate, many wiring substrates were cracked.

When the cracked wiring substrates were observed, the core substrate was peeled off vertically in the thickness direction, and the insulating layer and the wiring layer were formed on only one surface. Even in the wiring substrates which were not cracked, many fine cracks considered to be caused due to the cutting of the cutting device were formed on the side surfaces of the core substrates. Particularly, since the cutting by the cutting device was performed to the corners of the core substrate twice, many cracks were formed on the corners.

In the wiring substrate, the insulating layers and the wiring layers are formed on both surfaces of the core substrate formed of glass. The thermal expansion coefficient of the insulating layer and the wiring layer is larger than the thermal expansion coefficient of the core substrate formed of glass. If a heat cycle is applied to the wiring substrate, stress is applied to the glass substrate due to the difference of the thermal expansion coefficients. If the cracks are formed on the side surfaces of the core substrate, the core substrate is peeled off due to the stress which is applied to the core substrate from the laminated portion. Due to this phenomenon, it was found that the wiring substrate was cracked.

In the wiring substrate 10 of the present embodiment, the side surfaces of the core substrate 12 are partially covered with the resins 12a. Since the resins 12a are flexible, even when the wiring substrate is cut by the cutting device, cracks are not formed on the resins 12a which cover the side surfaces of the core substrate 12.

The cracks are formed due to the cutting of the cutting device in the side surfaces of the core substrate 12 which are not covered with the resins 12a. However, due to the resins 12a, it is possible to prevent the core substrate 10 from being peeled off In this way, according to the present embodiment, cracks of the wiring substrate are prevented, and durability, production yield, productivity, or the like of the wiring substrate can be improved.

(Manufacturing Method of Wiring Substrate)

A manufacturing method of a wiring substrate according to the first embodiment will be described with reference to FIGS. 2A to 7B. FIGS. 2A to 2F and FIGS. 4A to 7B are process cross-sectional views showing the manufacturing method of a wiring substrate according to the first embodiment, and FIG. 3 is a plan view of an opening formation process in the manufacturing method of a wiring substrate according to the first embodiment.

Figure 2A:
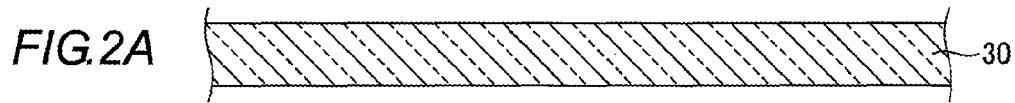
FIGS. 2A to 2F are process cross-sectional views showing a manufacturing method of a wiring substrate according to a first embodiment.
Figure 3:
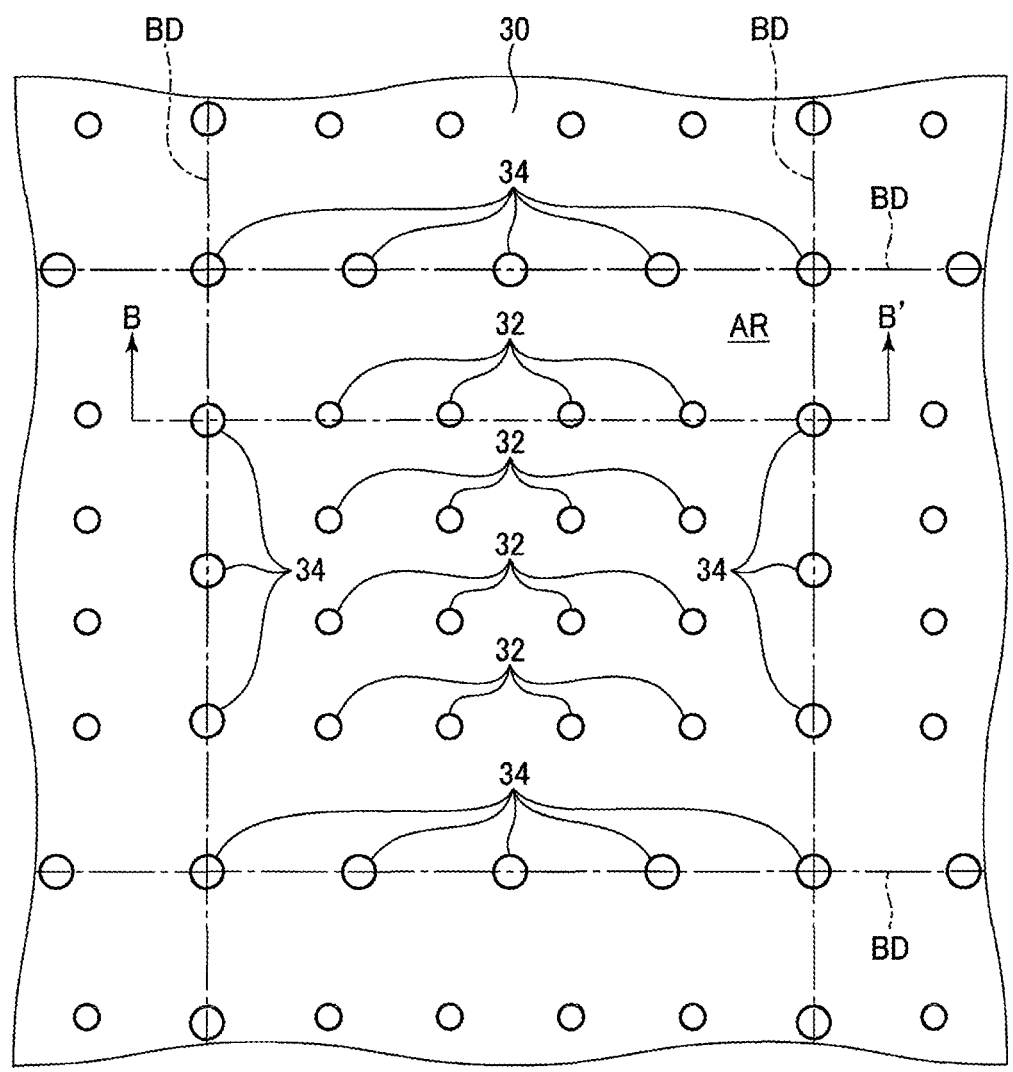
FIG. 3 is a plan view of an opening formation process in the manufacturing method of the wiring substrate according to the first embodiment.

First, a glass substrate 30, which becomes core substrates of a plurality of wiring substrates, is prepared (FIG. 2A).

For example, the glass substrate 30 has a thickness of approximately 200 μm. As the glass forming the glass substrate 30 which becomes the core substrates, soda glass, quartz glass, borosilicate glass, alkali-free glass, photosensitive glass, crystalline glass, or the like may be used.

A plurality of core substrate areas, which become core substrates of wiring substrates, are provided on the glass substrate 30. Boundaries are set between core substrate areas when the glass substrate is divided into respective core substrates by the cutting device.

Figure 2B:
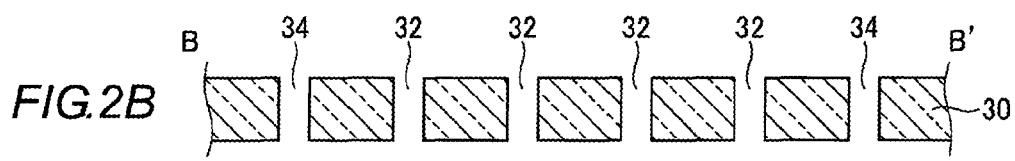

Subsequently, through-electrode openings 32 and resin filling openings 34 are formed on the glass substrate 30 (FIG. 2B and FIG. 3). FIG. 2B is a cross-sectional view taken along line B-B' of the plan view of FIG. 3.

As a method of forming the openings 32 and 34 in the glass substrate 30, there is a method by laser irradiation, a method by laser irradiation and wet etching, a method by electric discharge machining, or the like, and the openings may be formed by any method.

In FIG. 2B, cross-sectional shapes of the openings 32 and 34 are straight shapes in which the diameters are approximately constant. However, other shapes may be used according to adjustment of the method of the laser irradiation, the wet etching, the electric discharge machining, or the like.

Figure 2C:
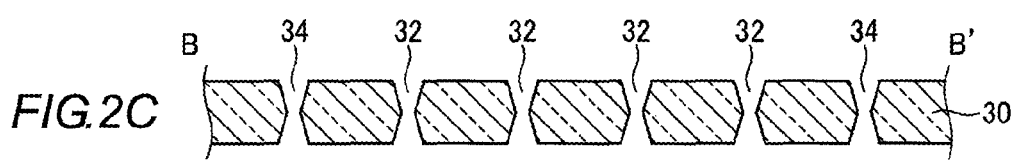
Figure 2D:
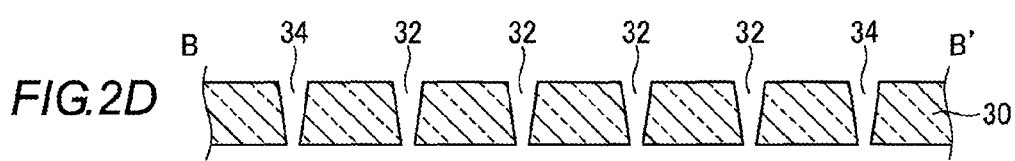
Figure 2E:
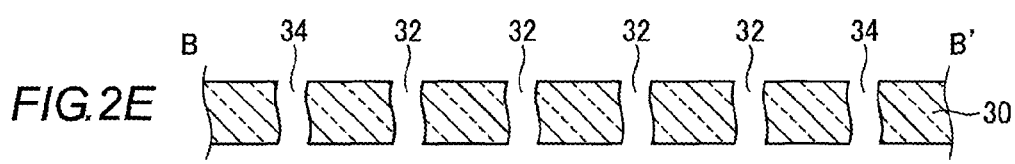

FIG. 2C shows a case where the openings 32 and 34 have drum shapes in which the diameters of the center portions are decreased. FIG. 2D shows a case where the openings 32 and 34 have taper shapes in which the diameters are gradually decreased. FIG. 2E shows a case where the openings 32 and 34 have uneven shapes in which the side surfaces of the diameter are uneven.

The shapes of the openings 32 and 34 shown in FIGS. 2C, 2D, and 2E can be formed by adjustment of the laser irradiation method or by combination of the laser irradiation and the wet etching. The uneven shapes of the openings 32 and 34 shown in FIG. 2E can be formed by the electric discharge machining.

In the cases of the drum shapes, the taper shapes, and the uneven shapes shown in FIGS. 2C, 2D, and 2E, as described below, when the resins 12a are filled in the openings 34, adhesiveness between the resins 12a and the inner surfaces of the openings 34 is improved.

Dispositions of the through-electrode openings 32 and the resin filling openings 34 formed on the glass substrate 30 will be described with reference to FIG. 3.

A plurality of square core substrate areas AR, which become the core substrates of the wiring substrates, are provided on the glass substrate 30. Boundaries BD for separating the glass substrate 30 into respective core substrates by the cutting device are set between the core substrate areas AR.

As shown in FIG. 3, the resin filling openings 34 are formed on areas which include the boundaries BD. One opening 34 is formed at a location at which the boundaries BD cross each other, and three openings 34 are formed along each side of the square core substrate area AR.

The diameters of the resin filling openings 34 are larger than a width (not shown) of the glass substrate 30 which is removed when the cutting device cuts along the boundaries BD, that is, a width of the cutting blade of the cutting device. For example, the width of the glass substrate 30 which is removed when the cutting device cuts is approximately 400 μm, and for example, the diameter of the resin filling opening 34 is 1.5 times or more of approximately 400 μm, that is, approximately 600 μm or more. It is preferable that the diameter of the opening 34 for filling the resin be approximately 450 to 1000 μm.

Thereby, even after the core substrate is cut by the cutting device, the resin filled in the openings 34 remains on the side surfaces of the core substrate and covers the side surface.

As shown in FIG. 3, the through-electrode openings 32 are formed in the square core substrate area AR. For example, 16 openings 32 of four rows and four columns are formed.

The diameter of the through-electrode opening 32 is set to an appropriate diameter as the through-electrode which penetrates the core substrate, and for example, the diameter is set to 50 μm.

Figure 2F:
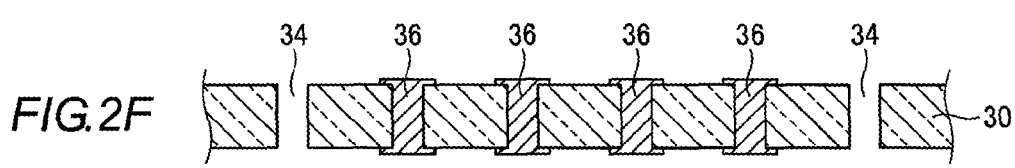

Subsequently, for example, conductive materials including copper are filled in the through-electrode openings 32 of the glass substrate 30, and thus, through-electrodes 36 are formed (FIG. 2F).

As the method for embedding the conductive materials into the openings 32 of the glass substrate 30, there is a plating method, a filling method, or the like, and the embedding may be performed by any method.

For example, electroless plating of copper is performed on the front surface of the glass substrate 30 including the inner walls of the openings 32, and a seed layer is formed. Subsequently, electroplating of copper is performed while using the seed layer as a feeding layer, and copper is filled in the openings 32. Thereafter, the seed layer, which is exposed from the electroplating layer, is removed, and the through-electrodes 36 are formed.

In addition, as shown in FIG. 2F, pads having lager diameters than those of the openings 32 are provided on both ends of through-electrodes 36.

Moreover, a wiring layer (wiring pattern), which is connected to the through-electrodes 36, may be provided on one surface or both surfaces of the core substrate 30.

Subsequently, resins are filled into the resin filling openings 34 of the glass substrate 30. A method for filling the resin into the openings 34 will be described in detail with reference to FIGS. 4A to 4D.

Figure 4A:
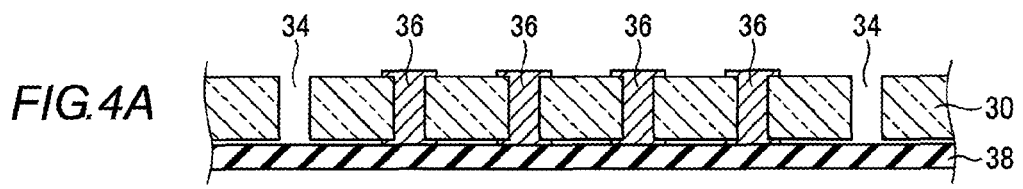
FIGS. 4A to 4D are process cross-sectional views showing the manufacturing method of the wiring substrate according to the first embodiment.

First, a resin film 38 is attached to the lower surface of the glass substrate 30 (FIG. 4A).

For example, the resin film 38 is formed of a semi-cured (B stage shape) thermosetting resin, and for example, the thickness of the resin film is 30 μm. For example, the thermosetting resin is a thermosetting epoxy resin.

Figure 4B:
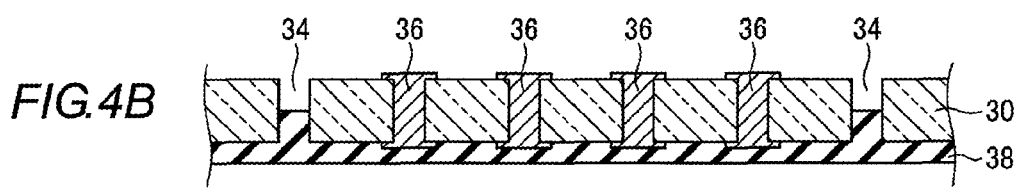

Subsequently, if pressure is applied to the glass substrate by an air bag (not shown) while the entire glass substrate is heated in a vacuum chamber (not shown) of a vacuum laminator (not shown), as shown in FIG. 4B, the resin film 38 closely contacts the lower surface of the glass substrate 30, and the resin is filled to an approximately half from the lower surface in the resin filling openings 34.

Figure 4C:
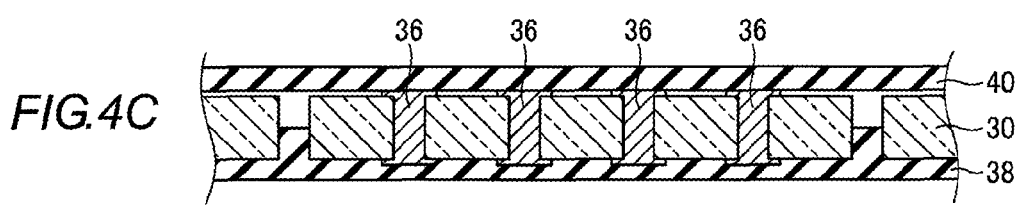

Subsequently, a resin film 40 is attached to the upper surface of the glass substrate 30 (FIG. 4C).

For example, the resin film 40 is formed of a semi-cured thermosetting resin, and for example, the thickness of the resin film is 30 μm. For example, the thermosetting resin is a thermosetting epoxy resin.

Figure 4D:
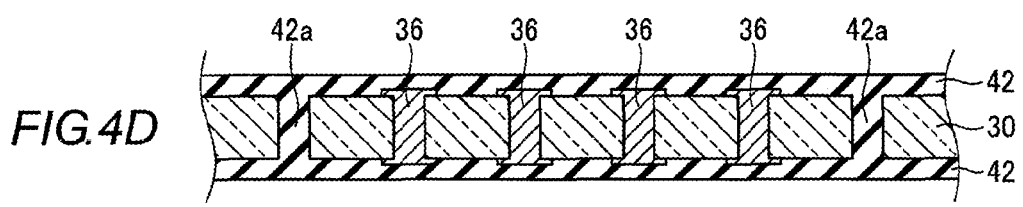

Subsequently, if pressure is applied to the glass substrate by an air bag (not shown) while the entire glass substrate is heated in a vacuum chamber (not shown) of a vacuum laminator, as shown in FIG. 4D, the resin film 40 closely contacts the upper surface of the glass substrate 30, and the resin is filled from the upper surface in the resin filling openings 34.

Thereafter, the resin films 38 and 40 are cured completely by heating and become insulating layers 42. As a result, as shown in FIG. 4D, the insulating layers 42 are formed on both upper and lower surfaces of the glass substrate 30, and resins 42a are filled in the resin filling openings 34. The insulating layers 42 and the resins 42a are integrated to each other.

Figure 5A:
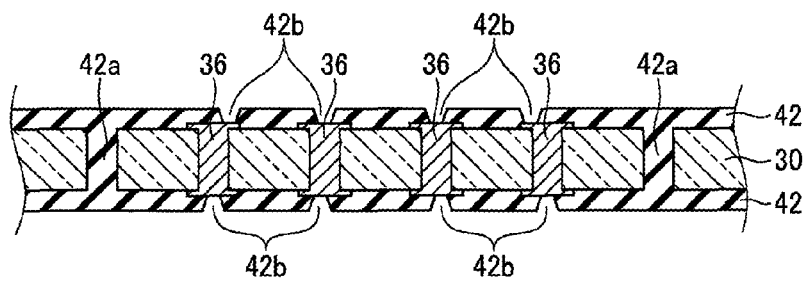
FIGS. 5A to 5C are process cross-sectional views showing the manufacturing method of the wiring substrate according to the first embodiment.

Subsequently, openings 42b, which reach the through-electrodes 36, are formed in the insulating layers 42 formed on both surfaces of the glass substrate 30 (FIG. 5A). For example, a method of forming the openings 42b in the insulating layers 42 is performed using laser.

Figure 5B:
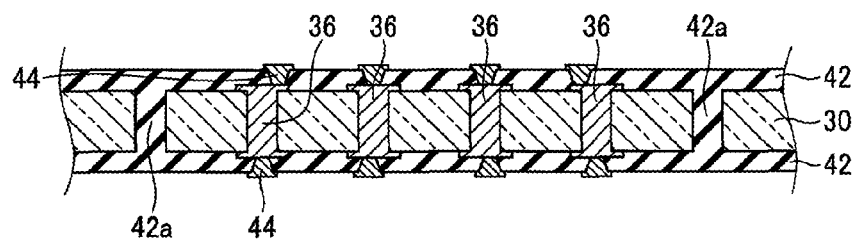

Subsequently, for example, wiring layers 44 including copper are formed on the insulating layers 42 of both surfaces of the glass substrate 30 (FIG. 5B). For example, a seed layer (not shown) is formed on the insulating layer 42, a photoresist layer (not shown) is formed on the seed layer, patterning is performed on the photoresist layer in a predetermined pattern, and the wiring layers 44 having predetermined patterns are formed by an electroplating method. Thereafter, the photoresistor layer is removed, and the seed layer is removed.

Figure 5C:
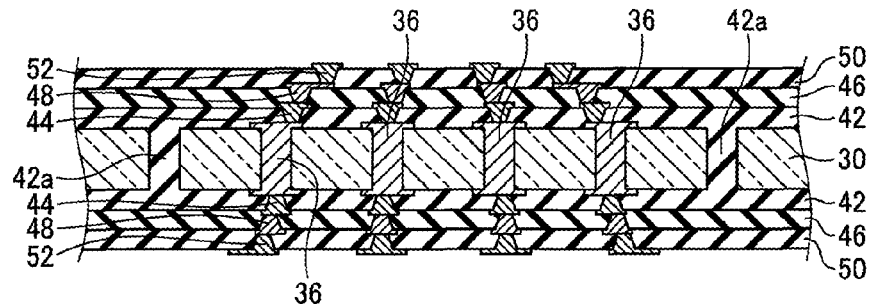

Subsequently, for example, resin films (not shown), which are formed of a semi-cured thermosetting resin, are laminated on the wiring layers 44 of both surfaces of the glass substrate 30 and are cured by heating, and thus, insulating layers 46 are formed (FIG. 5C). For example, the thermosetting resin is a thermosetting epoxy resin.

Subsequently, openings, which reach the wiring layers 44, are formed in the insulating layers 46 of both surfaces of the glass substrate 30. For example, a method of forming the openings in the insulating layers 46 is performed using laser.

Subsequently, for example, wiring layers 48 including copper are formed on the insulating layers 46 of both surfaces of the glass substrate 30 (FIG. 5C). For example, the wiring layers 48 are formed according to the method similar to the wiring layers 44.

Subsequently, insulating layers 50 are formed on the wiring layers 48 of both surfaces of the glass substrate 30 (FIG. 5C). For example, the insulating layers 50 are formed according to the method similar to the insulating layers 46.

Subsequently, openings, which reach the wiring layers 48, are formed in the insulating layers 50 of both surfaces of the glass substrate 30. For example, a method of forming the openings in the insulating layers 50 is performed using laser.

Subsequently, for example, wiring layers 52 including copper are formed on the insulating layers 50 of both surfaces of the glass substrate 30 (FIG. 5C). For example, the wiring layers 52 are formed by the method similar to the wiring layers 44.

Figure 6A:
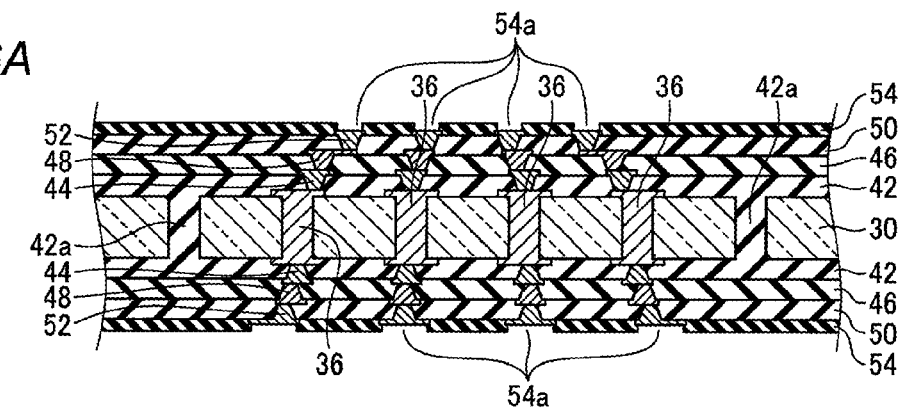
FIGS. 6A to 6C are process cross-sectional views showing the manufacturing method of the wiring substrate according to the first embodiment.

Subsequently, for example, photosensitive solder resist films (not shown) which are formed of an epoxy based resin, an acrylic resin, or the like, are attached to the wiring layers 52 of both surfaces of the glass substrate 30, and thus, solder resist layers 54 are formed (FIG. 6A).

Subsequently, the solder resist layers 54 of the both surfaces of the glass substrate 30 are exposed and developed in a predetermined pattern, and thus, openings 54a which reach the wiring layers 52 are formed (FIG. 6A).

Figure 6B:
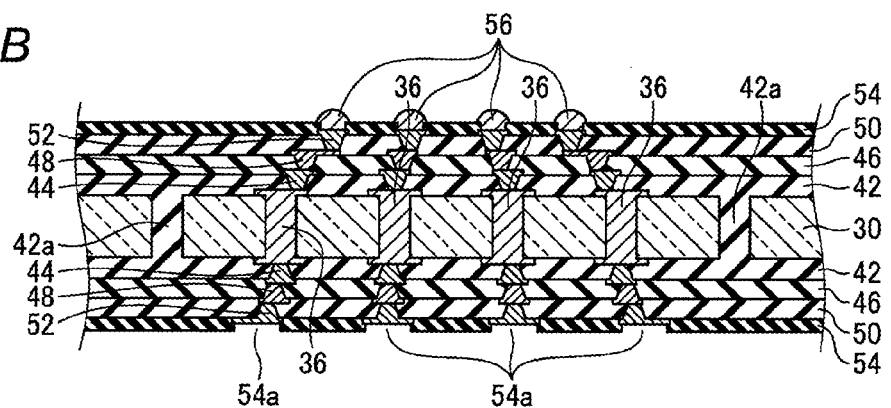

Subsequently, bumps (connection terminals) 56 for connecting the semiconductor chip 62 (FIG. 7B) are formed on the wiring layers (electrode pads) 52 which are exposed from the openings 54a of the solder resist layer 54 at the upper surface side of the glass substrate 30 (FIG. 6B).

Figure 6C:
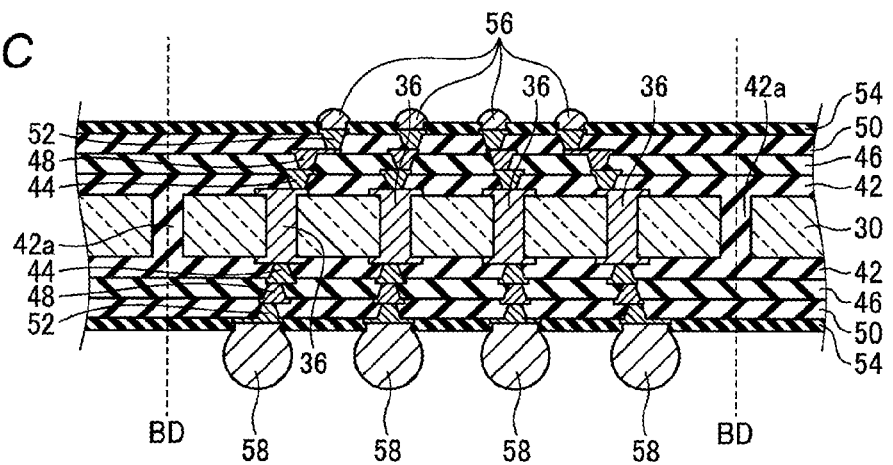

Subsequently, bumps (connection terminals) 58 for connecting another substrate (not shown) are formed on the wiring layers (electrode pads) 52 which are exposed from openings 54a of the solder resist layer 54 at the lower surface side of the glass substrate 30 (FIG. 6C).

For example, the bumps (connection terminals) 56 and the bumps (connection terminals) 58 are formed of solder.

Figure 7A:
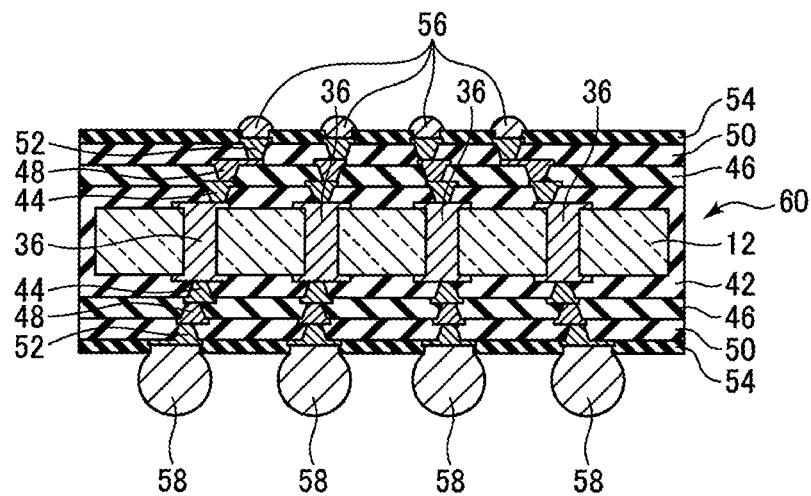
FIGS. 7A and 7B are process cross-sectional views showing the manufacturing method of the wiring substrate according to the first embodiment.
Figure 7B:
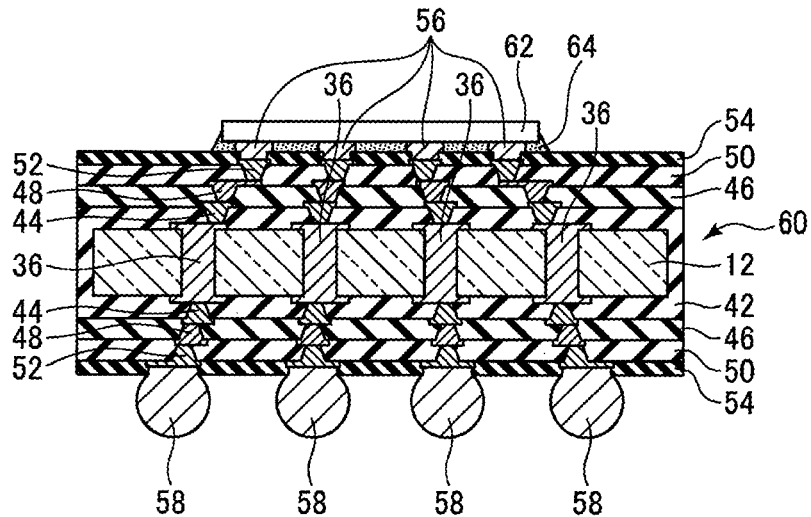

Subsequently, if the structure shown in FIG. 6C is cut by cutting device along boundaries BD which pass through approximately centers of the openings 34 and is divided into a plurality of pieces, a wiring substrate 60 shown in FIG. 7A is completed.

Subsequently, the semiconductor chip 62 is mounted on the upper side surface of the wiring substrate 60, and an under-fill resin 64 is filled between the wiring substrate 60 and the semiconductor chip 62. The semiconductor chip 62 is electrically connected to the wiring substrate 60 through the bumps (connection terminals) 56.

In this way, according to the present embodiment, it is possible to manufacture the wiring substrate in which durability, production yield, productivity, or the like is improved.

(Modification Example of Method of Filling Resin into Opening of Glass Substrate)

In the above-described embodiment, according to the resin filling method shown in FIGS. 4A to 4D, the resins are filled into the resin filling openings 34 of the glass substrate 30. However, the present invention is not limited to the method, and other methods may be used.

Modification examples of the resin filling method which fills resins into the resin filling openings 34 of the glass substrate 30 will be described with reference to FIGS. 8A to 10E.

(First Modification Example)

A first modification example of the resin filling method of the openings of the glass substrate will be described with reference to FIGS. 8A to 8D.

Figure 8A:
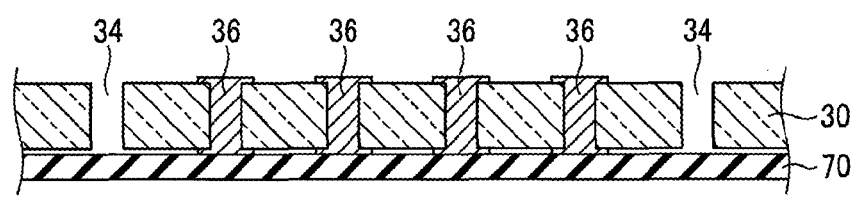
FIGS. 8A to 8D are process cross-sectional views showing a first modification example of a resin filling process in the manufacturing method of the wiring substrate according to the first embodiment.

First, a resin film 70 is attached to the lower surface of the glass substrate 30 (FIG. 8A).

For example, the resin film 70 is formed of a semi-cured thermosetting resin, and for example, the thickness of the resin film is 30 μm. For example, the thermosetting resin is a thermosetting epoxy resin.

Figure 8B:
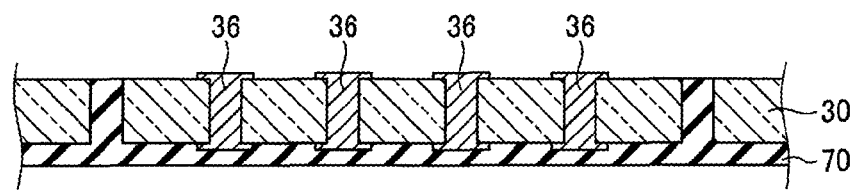

Subsequently, if strong pressure is applied to the glass substrate by an air bag (not shown) while the entire glass substrate is heated in a vacuum chamber (not shown) of a vacuum laminator, as shown in FIG. 8B, the resin film 70 closely contacts the lower surface of the glass substrate 30, and the resin is filled completely full in resin filling openings 34 from the lower surface.

Figure 8C:
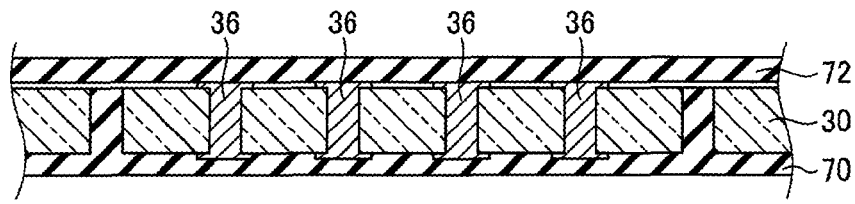

Subsequently, a resin film 72 is attached to the upper surface of the glass substrate 30 (FIG. 8C). Thereafter, the resin films 70 and 72 are cured completely by heating and become insulating layers 42.

Figure 8D:
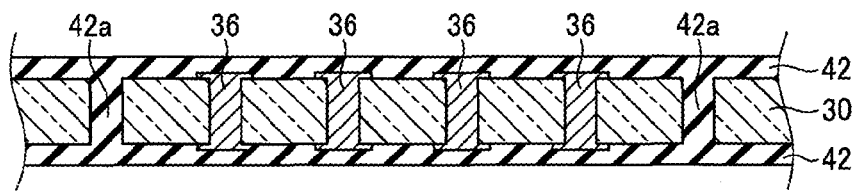

As a result, as shown in FIG. 8D, the insulating layers 42 are formed on both upper and lower surfaces of the glass substrate 30, and the resins 42a are filled in the entire resin filling openings 34. The insulating layers 42 and the resins 42a are integrated to each other.

Thereafter, the wiring substrate 60 is formed by the method shown in FIGS. 5A to 7B.

(Second Modification Example)

A second modification example of the resin filling method of the openings of the glass substrate will be described with reference to FIGS. 9A and 9B.

Figure 9A:
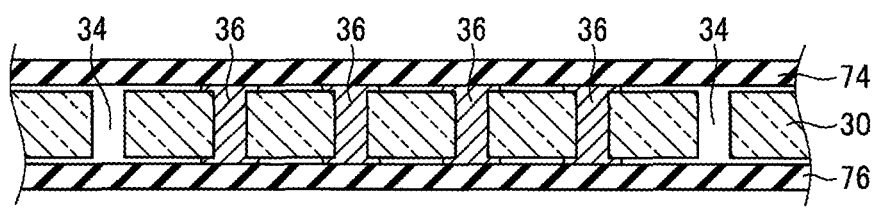
FIGS. 9A and 9B are process cross-sectional views showing a second modification example of the resin filling process in the manufacturing method of the wiring substrate according to the first embodiment.

First, resin films 74 and 76 are attached to both upper and lower surfaces of the glass substrate 30 (FIG. 9A).

For example, the resin films 74 and 76 are formed of a semi-cured thermosetting resin, and for example, the thicknesses of the resin films are 30 μm. For example, the thermosetting resin is a thermosetting epoxy resin.

Figure 9B:
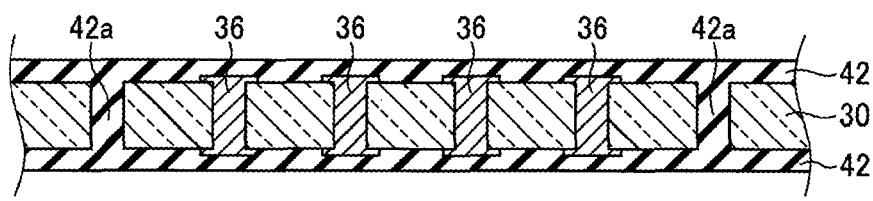

Subsequently, if strong pressure is applied to the glass substrate by an air bag (not shown) while the entire glass substrate is heated in a vacuum chamber (not shown) of a vacuum laminator, as shown in FIG. 9B, the resin films 74 and 76 closely contact both upper and lower surfaces of the glass substrate 30, and the resins are entirely filled in resin filling openings 34 from both upper and lower surfaces. Thereafter, the resin films 74 and 76 are cured completely by heating and become insulating layers 42.

As a result, as shown in FIG. 9B, the insulating layers 42 are formed on both upper and lower surfaces of the glass substrate 30, and the resins 42a are entirely filled in the resin filling openings 34. The insulating layers 42 and the resins 42a are integrated to each other.

Thereafter, the wiring substrate 60 is formed by the method shown in FIGS. 5A to 7B.

(Third Modification Example)

A third modification example of the resin filling method of the openings of the glass substrate will be described with reference to FIGS. 10A to 10E.

First, an adhesive tape 78, which can be easily peeled off, is attached to the lower surface of the glass substrate 30, and the bottom of the resin filling openings 34 is closed (FIG. 10A).

Subsequently, a liquid or paste-like resin 80 is supplied to the upper surface of the glass substrate 30, and a squeegee 82 is operated under vacuum atmosphere (FIG. 10A).

A height of the squeegee 82 is adjusted so that only a predetermined height is positioned above the upper surface of the glass substrate 30. If the squeegee 82 is operated, the resin 80 is pushed into the resin filling openings 34 to a certain degree.

For example, as the resin 80, a thermosetting resin such as an epoxy resin, an acrylic resin, a polyimide resin, or a silicone resin is used.

Subsequently, if atmospheric pressure is increased, the resin 80 is reached to the bottom of the resin filling openings 34 due to difference of air pressure in the resin filling openings 34 (FIG. 10B).

Subsequently, a scraper 84 is moved along the upper surface of the glass surface 30, and the resin 80 remaining on the upper surface of the glass substrate 30 is removed (FIG. 10C). Thereafter, the resin 80 is cured completely by heating.

Subsequently, the adhesive tape 78 attached to the lower surface of the glass substrate 30 is peeled off (FIG. 10D).

In this way, the resin 80 is filled into the resin filling openings 34 of the glass substrate 30.

Subsequently, insulating layers 42 are formed on both upper and lower surfaces of the glass substrate 30 (FIG. 10E).

Thereafter, the wiring substrate 60 is formed by the method shown in FIGS. 5A to 7B.

(Modification Example of Location of Through-Electrode Opening and Resin Filling Opening)

In the above-described embodiment, the through-electrode openings 32 and the resin filling openings 34 are formed on the glass substrate 30 as shown in FIG. 3. As a result, as shown in FIG. 1A, the wiring substrate 10, in which side surfaces of the core substrate 12 formed of glass are partially covered with the resins 12a, is manufactured. However, the present invention is not limited to this location and other locations may be used.

Modification examples of locations of the through-electrode openings 32 and the resin filling openings 34, which are formed on the glass substrate 30, will be described with reference to FIGS. 11A to 15B.

(First Modification Example)

Figure 11A:
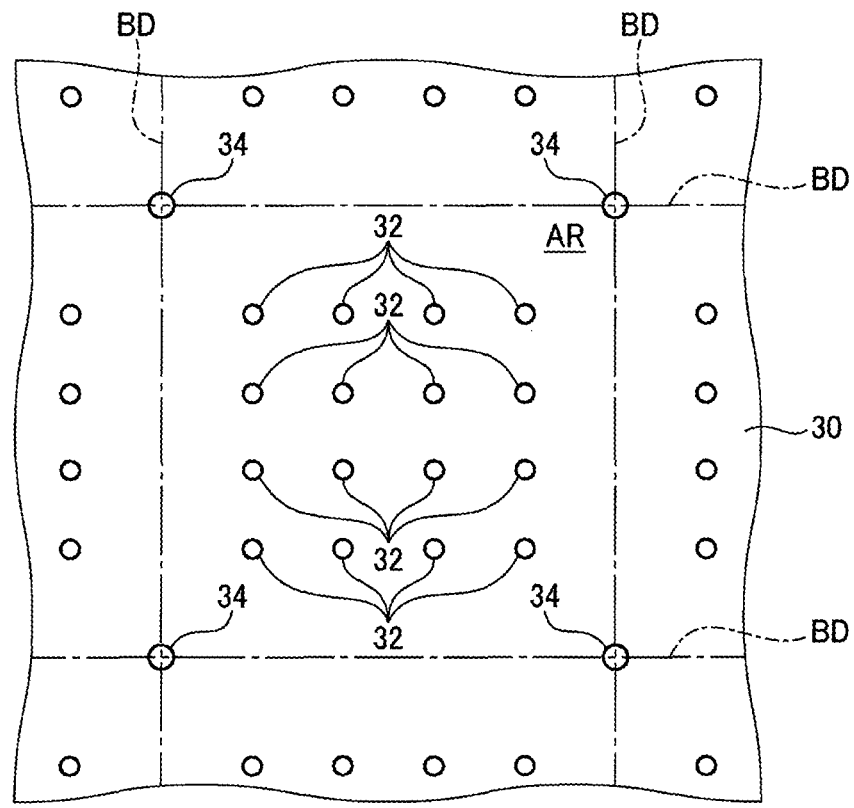
FIGS. 11A and 11B are views showing a first modification example of the wiring substrate of the first embodiment.
Figure 11B:
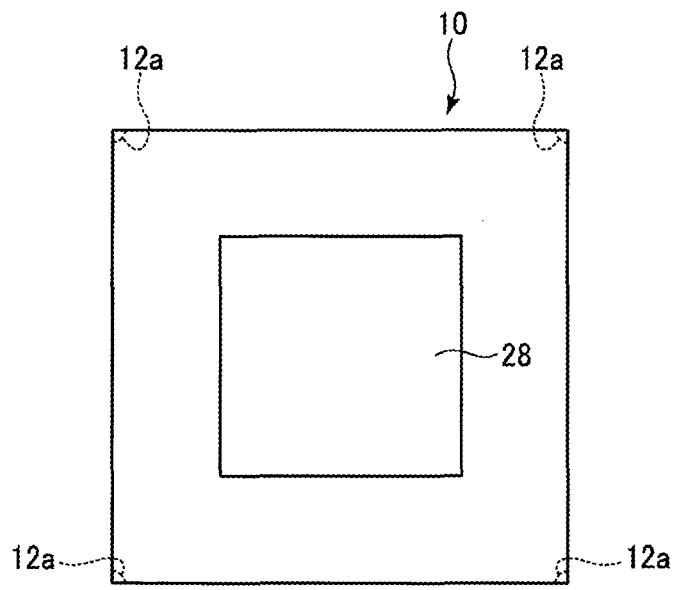

A first modification example of the location of the through-electrode openings 32 and the resin filling openings 34, which are formed on the glass substrate 30, will be described with reference to FIGS. 11A and 11B. FIG. 11A corresponds to FIG. 3 and FIG. 11A is a plan view showing the location of the through-electrode openings 32 and the resin filling openings 34, and FIG. 11B corresponds to FIG. 1A and FIG. 11B is a plan view of the wiring substrate 10. The same reference numerals are attached to the same elements as those of FIGS. 1A and 3, and the overlapped descriptions are omitted herein.

In the present modification example, the resin filling openings 34 are formed only at locations at which boundaries BD cross each other.

The plurality of square core substrate areas AR, which become the core substrates of the wiring substrates, are provided on the glass substrate 30. Boundaries BD for dividing the glass substrate 30 into respective core substrates by the cutting device are set between the core substrate areas AR.

As shown in FIG. 11A, the resin filling openings 34 are formed at locations at which boundaries BD cross each other.

The diameters of the resin filling openings 34 are larger than a width of the glass substrate 30 which is removed when the cutting device cuts along the boundaries BD, that is, a width of the cutting blade of the cutting device. Thereby, even after the core substrate is cut by the cutting device, the resin filled in the openings 34 remains on the side surfaces of the core substrate and cover the side surface.

As shown in FIG. 11A, the through-electrode openings 32 are formed in the square core substrate area AR. For example, 16 openings 32 of four rows and four columns are formed.

As shown in FIG. 11B, in the wiring substrate 10 of the first modification example, the side surfaces of the core substrate 12 formed of glass are partially covered with the resins 12a. The side surfaces of four corners of the core substrate 12 are covered with the resins 12a.

In this way, according to the present modification, since side surfaces of the corners of the core substrate are covered with resin, cracks of the wiring substrate are prevented, and thus, durability, production yield, productivity, or the like of the wiring substrate can be improved.

(Second Modification Example)

Figure 12A:
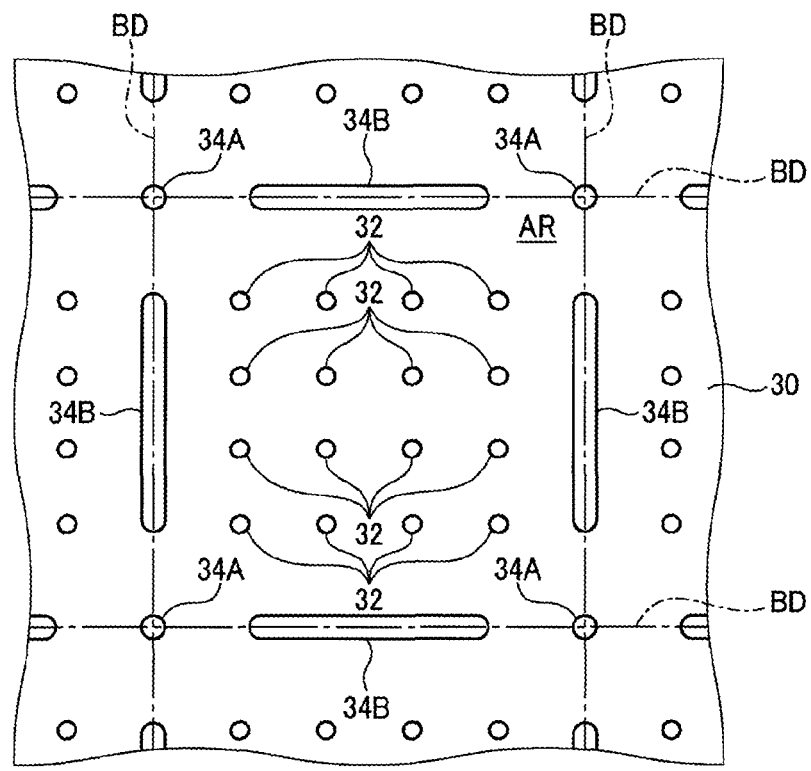
FIGS. 12A and 12B are views showing a second modification example of the wiring substrate of the first embodiment.
Figure 12B:
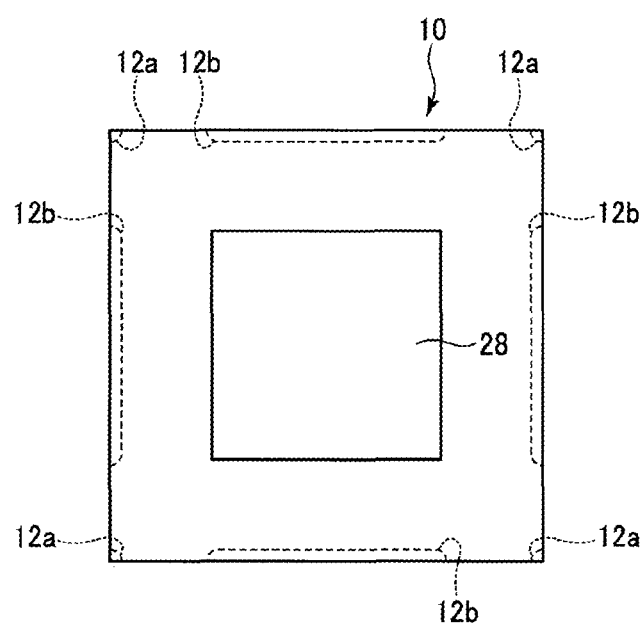

A second modification example of the location of the through-electrode openings 32 and the resin filling openings 34, which are formed through the glass substrate 30, will be described with reference to FIGS. 12A and 12B. FIG. 12A corresponds to FIG. 3 and FIG. 12A is a plan view showing the location of the through-electrode openings 32 and the resin filling openings 34, and FIG. 12B corresponds to FIG. 1A and FIG. 12B is a plan view of the wiring substrate 10. The same reference numerals are given to the same elements as those of FIGS. 1A and 3, and the overlapped descriptions are omitted herein.

In the present modification example, the resin filling openings 34 are formed at locations at which boundaries BD cross each other and on the areas along each side of the core substrate area AR.

The plurality of square core substrate areas AR, which become the core substrates of the wiring substrates, are provided on the glass substrate 30. Boundaries BD for dividing the glass substrate 30 into respective core substrates by the cutting device are set between the core substrate areas AR.

As shown in FIG. 12A, in the resin filling openings 34, circular openings 34A are formed at locations in which boundaries BD cross each other, and elongated openings 34B are formed on areas along each side of the core substrate area AR.

The diameters of the circular openings 34A are larger than the width which is removed when the cutting device cuts along the boundaries BD, that is, the width of the cutting blade of the cutting device.

The widths of the elongated openings 34B are larger than the width of the glass substrate 30 which is removed when the cutting device cuts along the boundaries BD, that is, the width of the cutting blade of the cutting device.

As shown in FIG. 12A, the through-electrode openings 32 are formed in the square core substrate area AR. For example, 16 openings 32 of four rows and four columns are formed.

As shown in FIG. 12B, in the wiring substrate 10 of the second modification example, the side surfaces of the core substrate 12 formed of glass are partially covered with the resins 12a and 12b. The side surfaces of four corners of the core substrate 12 are covered with the resins 12a, and the side surfaces of each side between corners of the core substrate 12 are covered with the resins 12b.

In this way, according to the present modification example, since the side surfaces of the corners and the side surfaces of each side of the core substrate are covered with resins, the cracks of the wiring substrate are more securely prevented, and thus, durability, production yield, productivity, or the like of the wiring substrate can be improved.

(Third Modification Example)

Figure 13A:
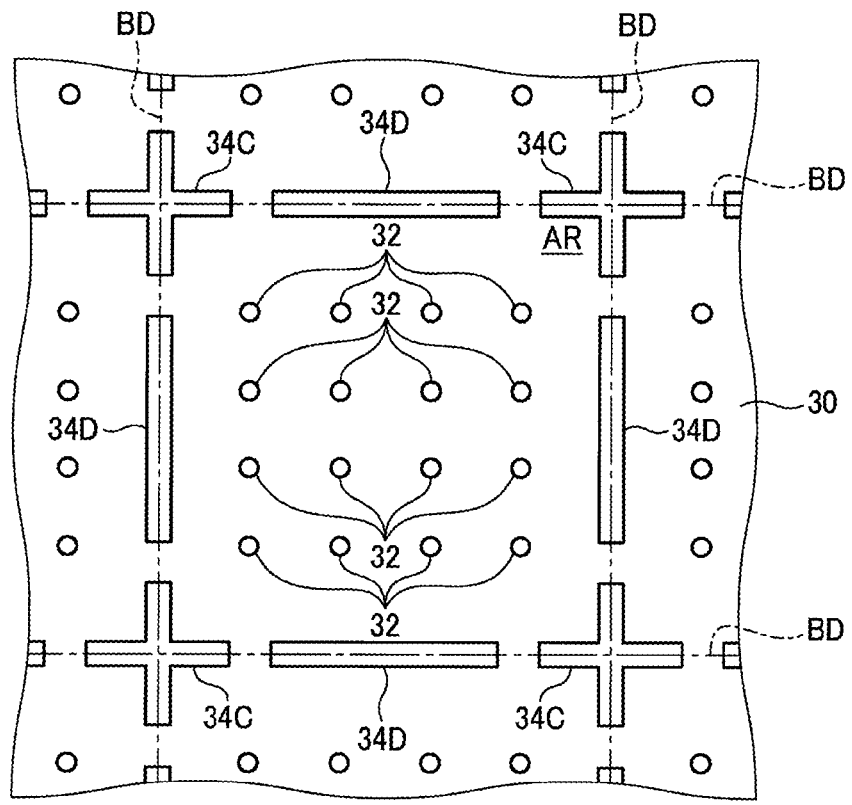
FIGS. 13A and 13B are views showing a third modification example of the wiring substrate of the first embodiment.
Figure 13B:
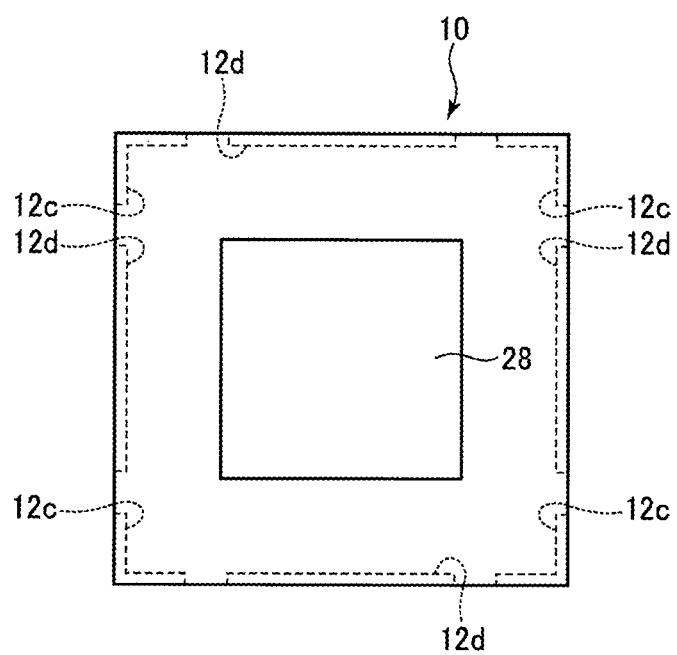

A third modification example of the disposition of the through-electrode openings 32 and the resin filling openings 34, which are formed through the glass substrate 30, will be described with reference to FIGS. 13A and 13B. FIG. 13A corresponds to FIG. 3 and FIG. 13A is a plan view showing the location of the through-electrode openings 32 and the resin filling openings 34, and FIG. 13B corresponds to FIG. 1A and FIG. 13B is a plan view of the wiring substrate 10. The same reference numerals are given to the same members as those of FIGS. 1A and 3, and the overlapped descriptions are omitted herein.

In the present modification example, the resin filling openings 34 are formed at sides near locations at which boundaries BD cross each other and on the areas along each side of the core substrate area AR.

The plurality of square core substrate areas AR, which become the core substrates of the wiring substrates, are provided on the glass substrate 30. Boundaries BD for dividing the glass substrate 30 into respective core substrates by the cutting device are set between the core substrate areas AR.

As shown in FIG. 13A, in the resin filling openings 34, cross-shaped openings 34C are formed at locations in which boundaries BD cross each other, and elongated openings 34D are formed on areas along each side of the core substrate area AR.

The widths of the cross-shaped openings 34C are larger than the width of the glass substrate 30 which is removed when the cutting device cuts along the boundaries BD, that is, the width of the cutting blade of the cutting device.

The widths of the elongated openings 34D are larger than the width of the glass substrate 30 which is removed when the cutting device cuts along the boundaries BD, that is, the width of the cutting blade of the cutting device.

As shown in FIG. 13A, the through-electrode openings 32 are formed in the square core substrate area AR. For example, 16 openings 32 of four rows and four columns are formed.

As shown in FIG. 13B, in the wiring substrate 10 of the third modification example, four corners and the side surfaces near the corners of the core substrate 12 formed of glass are covered with the resins 12c, and the side surfaces of each side between corners of the core substrate 12 are covered with resins 12d.

In this way, according to the present modification example, since the corners, the side surfaces near the corners, and the side surfaces of each side of the core substrate are covered with resins, the cracks of the wiring substrate are more securely prevented, and thus, durability, production yield, productivity, or the like of the wiring substrate can be improved.

(Fourth Modification Example)

Figure 14A:
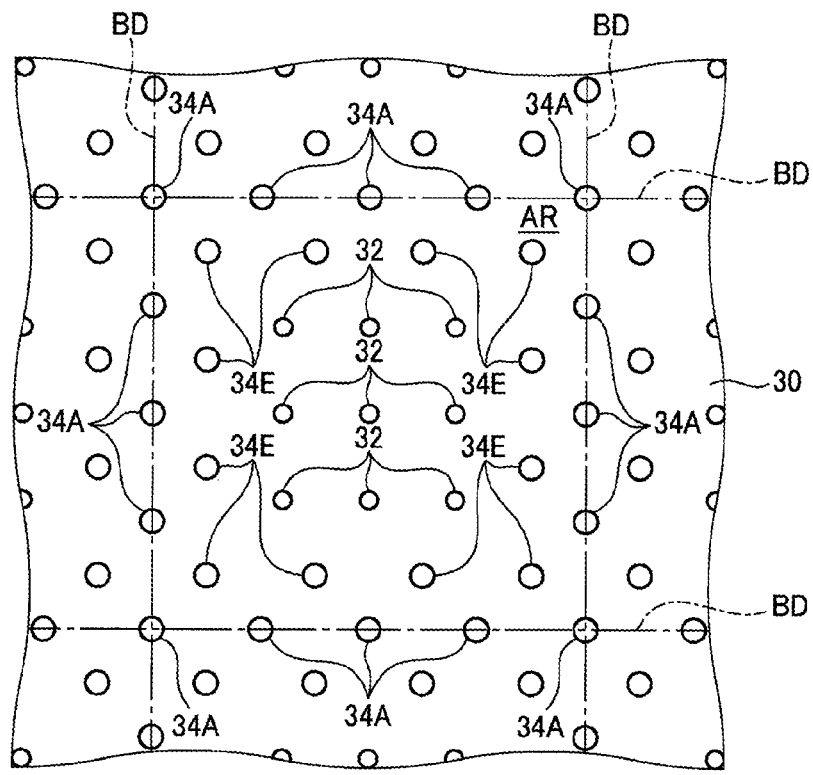
FIGS. 14A and 14B are views showing a fourth modification example of the wiring substrate of the first embodiment.
Figure 14B:
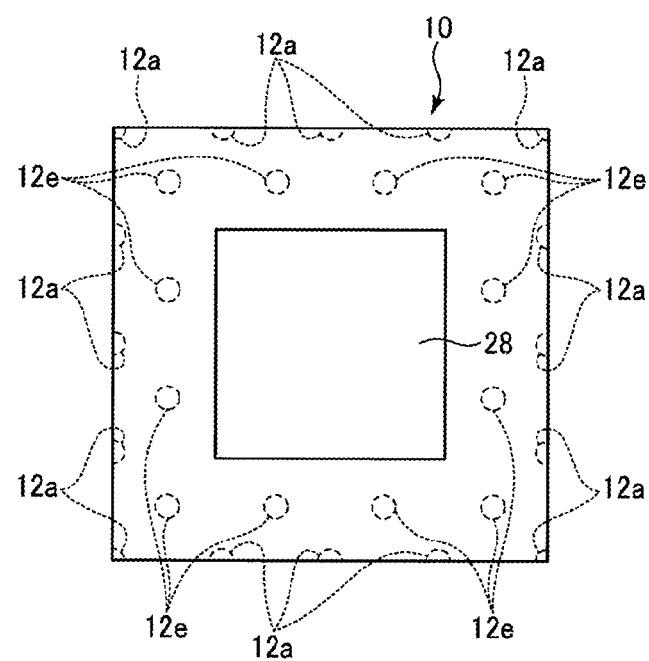

A fourth modification example of the location of the through-electrode openings 32 and the resin filling openings 34, which are formed through the glass substrate 30, will be described with reference to FIGS. 14A and 14B. FIG. 14A corresponds to FIG. 3 and FIG. 14A is a plan view showing the disposition of the through-electrode openings 32 and the resin filling openings 34, and FIG. 14B corresponds to FIG. 1A and FIG. 14B is a plan view of the wiring substrate 10. The same reference numerals are given to the same members as those of FIGS. 1A and 3, and the overlapped descriptions are omitted herein.

In the present modification example, in addition to the areas including the boundaries BD in the embodiment of FIGS. 1A and 3, the resin filling openings are also formed on areas adjacent to the boundaries BD.

The plurality of square core substrate areas AR, which become the core substrates of the wiring substrates, are provided on the glass substrate 30. Boundaries BD for dividing the glass substrate 30 into respective core substrates by the cutting device are set between the core substrate areas AR.

As shown in FIG. 14A, in the resin filling openings 34, circular openings 34A are formed at locations in which boundaries BD cross each other and on areas along each side of the core substrate area AR. Moreover, in the areas adjacent to the boundaries BD, circular openings 34E are formed between the circular openings 34A. That is, the circular openings 34E are formed near the locations at which the openings 34A are not formed on each side of the core substrate area AR.

The diameters of the circular openings 34A formed on areas including the boundaries BD are larger than the width of the glass substrate 30 which is removed when the cutting device cuts along the boundaries BD, that is, the width of the cutting blade of the cutting device.

As shown in FIG. 14A, it is preferable that the circular openings 34E formed on areas adjacent to the boundaries BD be positioned approximately in the middle of the circular openings 34A formed on areas including boundaries BD. The diameters of the circular openings 34E may be larger than the width of the cutting blade of the cutting device.

As shown in FIG. 14A, the through-electrode openings 32 are formed in the square core substrate area AR. For example, 9 openings 32 of three rows and three columns are formed.

As shown in FIG. 14B, in the wiring substrate 10 of the fourth modification example, the side surfaces of the core substrate 12 formed of glass are partially covered with the resins 12a. The side surfaces of four corners and the side surfaces of three locations of each side between corners of the core substrate 12 are covered with the resins 12a. Moreover, in areas adjacent to the side surfaces of the core substrate 12, resins 12e are embedded between the resins 12a of the side surfaces.

In this way, according to the present modification example, since the corners and the side surfaces of each side of the core substrate are covered with resins, the cracks of the wiring substrate are prevented, and thus, durability, production yield, productivity, or the like of the wiring substrate can be improved. In addition, since the resins 12e are embedded between the resins 12a of the side surfaces of the core substrate 12, breakage of the cracks of the side surfaces which are not covered with the resins 12a of the core substrate 12 can be prevented by the resins 12e.

(Fifth Modification Example)

Figure 15A:
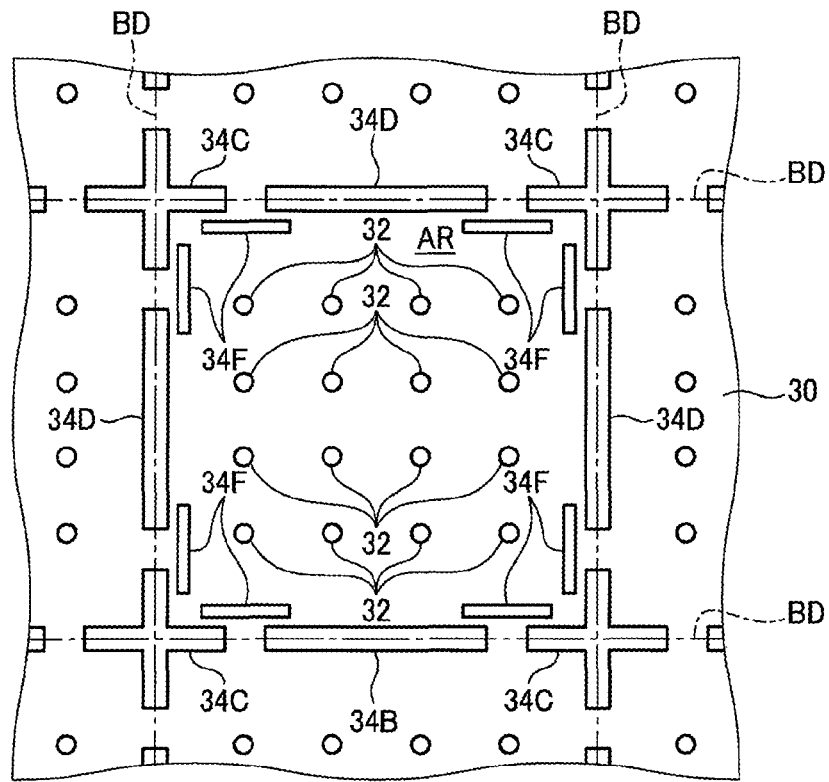
FIGS. 15A and 15B are views showing a fifth modification example of the wiring substrate of the first embodiment.
Figure 15B:
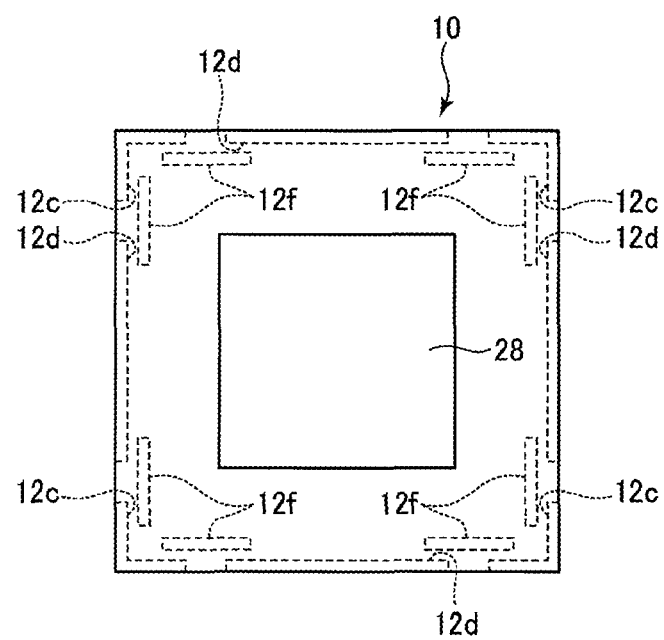

A fifth modification example of the disposition of the through-electrode openings 32 and the resin filling openings 34, which are formed through the glass substrate 30, will be described with reference to FIGS. 15A and 15B. FIG. 15A corresponds to FIG. 3 and FIG. 15A is a plan view showing the location of the through-electrode openings 32 and the resin filling openings 34, and FIG. 15B corresponds to FIG. 1A and FIG. 15B is a plan view of the wiring substrate 10. The same reference numerals are given to the same members as those of FIGS. 1A and 3, and the overlapped descriptions are omitted herein.

In the present modification example, in addition to the sides including locations at which boundaries BD cross each other and areas along each side of the core substrate area AR, the resin filling openings are also formed on areas adjacent to the boundaries BD.

The plurality of square core substrate areas AR, which become the core substrates of the wiring substrates, are provided on the glass substrate 30. Boundaries BD for dividing the glass substrate 30 into respective core substrates by the cutting device are set between the core substrate areas AR.

As shown in FIG. 15A, in the resin filling openings 34, cross-shaped openings 34C are formed at locations in which boundaries BD cross each other, and elongated openings 34D are formed on areas along each side of the core substrate area AR. Moreover, in the areas adjacent to the boundaries BD, elongated openings 34F are formed between cross-shaped openings 34C and elongated openings 34D. That is, the elongated openings 34F are formed near the locations at which openings 34C and 34D are not formed in each side of the core substrate area AR.

The widths of the cross-shaped openings 34C are larger than the width of the glass substrate 30 which is removed when the cutting device cuts along the boundaries BD, that is, the width of the cutting blade of the cutting device.

The widths of the elongated openings 34D are larger than the width of the glass substrate 30 which is removed when the cutting device cuts along the boundaries BD, that is, the width of the cutting blade of the cutting device.

As shown in FIG. 15A, it is preferable that the elongated opening 34F formed on areas adjacent to the boundaries BD be positioned between the cross-shaped openings 34C and the elongated openings 34D. The widths of the elongated openings 34F may be larger than the width of the cutting blade of the cutting device.

As shown in FIG. 15A, the through-electrode openings 32 are formed in the square core substrate area AR which is partitioned by the boundaries BD. For example, 16 openings 32 of four rows and four columns are formed.

As shown in FIG. 15B, in the wiring substrate 10 of the fifth modification example, the four corners and the side surfaces near the corners of the core substrate 12 formed of glass are covered with the resins 12c, and the side surfaces of each side between corners of the core substrate 12 are covered with resins 12d. In addition, in the areas adjacent to the side surfaces of the core substrate 12, resins 12f are embedded between the resins 12c and the resins 12d of the side surfaces.

In this way, according to the present modification example, since the corners, the side surfaces near the corners, and the side surfaces of each side of the core substrate are covered with resins, the cracks of the wiring substrate are prevented, and thus, durability, production yield, productivity, or the like of the wiring substrate can be improved. In addition, since the resins 12f are embedded between the resins 12c and the resins 12d of the side surfaces of the core substrate 12, breakage of the cracks of the side surfaces which are not covered with the resins of the core substrate 12 can be prevented by the resins 12f.

Second Embodiment (Wiring Substrate)

Figure 16A:
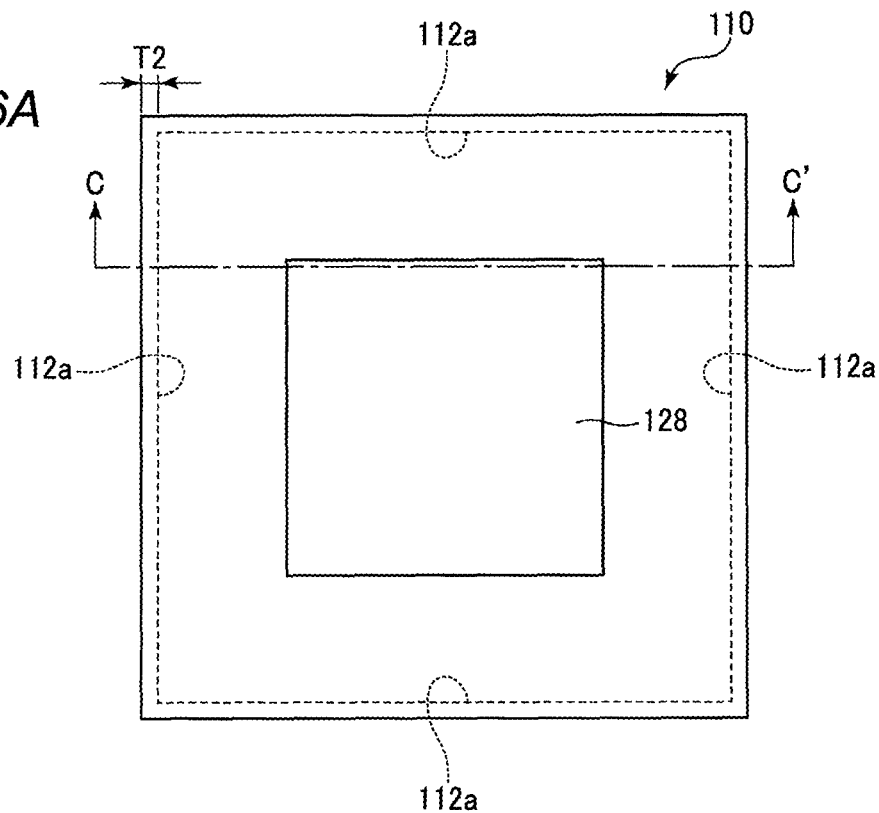
FIGS. 16A and 16B are views showing a wiring substrate according to a second embodiment.

A wiring substrate according to a second embodiment will be described with reference to FIGS. 16A and 16B. FIG. 16A is a plan view in a state where a semiconductor chip is mounted on the wiring substrate according to the present embodiment, and FIG. 16B is a cross-sectional view taken along line C-C' in the plan view of FIG. 16A.

Figure 16B:
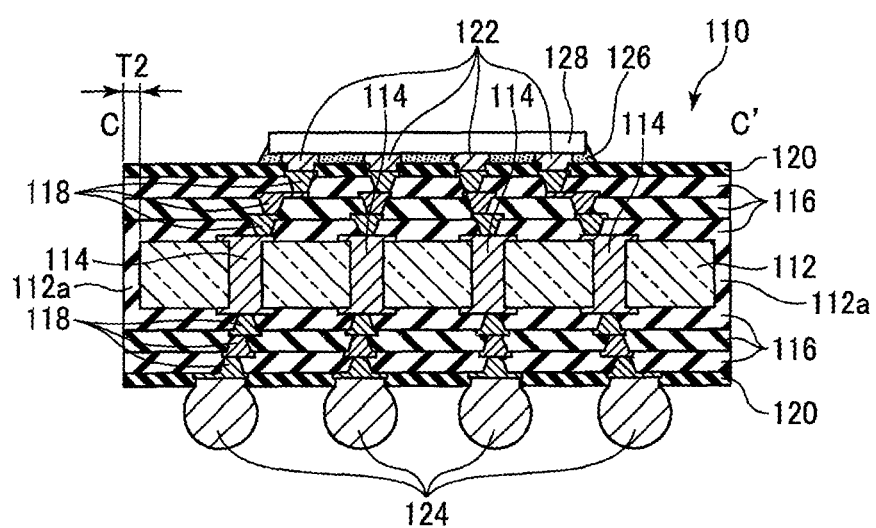

As shown in FIG. 16B, a wiring substrate 110 of the present embodiment includes a core substrate 112 which is formed of glass. For example, the core substrate 112 has a thickness of approximately 200 μm.

As the glass which forms the core substrate 112, soda glass, quartz glass, borosilicate glass, alkali-free glass, photosensitive glass, crystalline glass, or the like may be used.

A plurality of through-electrodes 114 are formed on the core substrate 112. For example, the through-electrode 114 has a diameter of approximately 50 μm, and is formed of copper.

Insulating layers 116 and wiring layers 118 are alternately formed on both upper and lower surfaces of the core substrate 112. For example, the insulating layer 116 has a thickness of approximately 30 μm and is formed of an epoxy based resin.

For example, the wiring layers 118 are formed on the insulating layers 116, in which openings for connection are formed, by plating copper.

The insulating layers 116 and the wiring layers 118 of the outermost layers of both upper and lower surfaces of the core substrate 112 are coated with solder resist layers 120. Openings which reach the wiring layers 118 are formed in the solder resist layers 120. For example, the solder resist layer 120 has a thickness of approximately 20 µm.

In the wiring substrate 110 of the present embodiment, a semiconductor chip 128 is mounted on the upper side surface, and the wiring substrate is mounted on another substrate (not shown) through the lower side surface.

Bumps (connection terminals) 122 for connecting the semiconductor chip 128 are formed in the openings of the solder resist layer 120 of the upper side surface of the wiring substrate 110. Bumps (connection terminals) 124 for connecting another substrate (not shown) are formed in the openings of the solder resist layer 120 of the lower side surface of the wiring substrate 110.

The semiconductor chip 128 is mounted on the upper side surface of the wiring substrate 110, and is electrically connected to the wiring substrate by bumps (connection terminals) 122. An under-fill resin 126 is filled between the wiring substrate 110 and the semiconductor chip 128.

As shown in FIG. 16A, in the wiring substrate 110 of the present embodiment, all side surfaces of the core substrate 112 formed of glass are covered with resins 112a.

For example, a thickness T2 of the resin 112a in an in-plane direction of the core substrate 112 is 100 µm. It is preferable that the thickness T2 be approximately 20 µm to 200 µm.

As the resins 112a which cover the side surfaces of the core substrate 112, a thermosetting epoxy resin, a polyimide resin, an acrylic resin, Teflon (registered trademark) based resin, or the like may be used.

As shown in FIG. 16B, in each side of the wiring substrate 110, the side surfaces of the insulating layers 116 and the side surfaces of the resins 112a exposed to the side surfaces of the wiring substrate 110 are formed so as to be flush with each other.

In the wiring substrate 110 of the present embodiment, since all side surfaces of the core substrate 112 are covered with the resins 112a, cracks from the side surfaces of the core substrate 10 can be prevented.

In this way, according to the present embodiment, cracks of the wiring substrate are prevented, and durability, production yield, productivity, or the like of the wiring substrate can be improved.

(Manufacturing Method of Wiring Substrate)

A manufacturing method of a wiring substrate according to a second embodiment will be described with reference to FIGS. 17A to 23B. FIGS. 17A to 17D, FIGS. 18A to 18C, and FIGS. 20A to 23B are process cross-sectional views showing the manufacturing method of a wiring substrate according to the second embodiment, and FIG. 19 is a plan view of a core substrate alignment process in the manufacturing method of a wiring substrate according to the second embodiment.

Figure 17A:
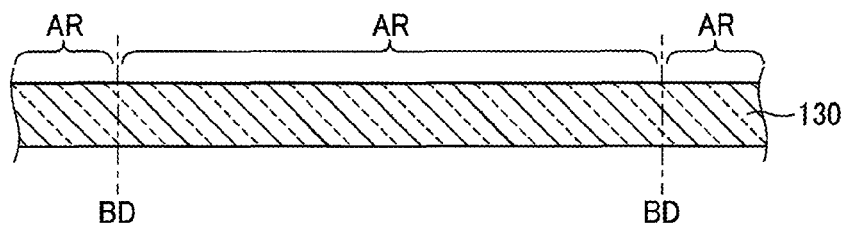
FIGS. 17A to 17D are process cross-sectional views showing a manufacturing method of the wiring substrate according to the second embodiment.

First, a glass substrate 130, which becomes core substrates of a plurality of wiring substrates, is prepared (FIG. 17A).

For example, the glass substrate 130 has a thickness of approximately 200 µm. As the glass forming the glass substrate 130 which becomes the core substrates, soda glass, quartz glass, borosilicate glass, alkali-free glass, photosensitive glass, crystalline glass, or the like may be used.

A plurality of square core substrate areas AR, which become core substrates of wiring substrates, are provided on the glass substrate 130. Boundaries BD for dividing the glass substrate 130 into respective core substrates by the cutting device are set between the core substrate areas AR.

Figure 17B:
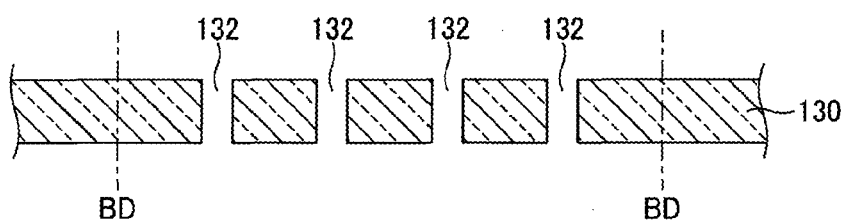

Subsequently, in the glass substrate 130, the through-electrode openings 132 are formed in each core substrate area AR (FIG. 17B). The diameter of the through-electrode opening 132 is set to an appropriate diameter as the through-electrode which penetrates the core substrate, and for example, the diameter is set to 50 µm.

As a method of forming the openings 132 in the glass substrate 130, there is a method by laser irradiation, a method by laser irradiation and wet etching, a method by electric discharge machining, or the like, and the openings may be formed by any method.

In FIG. 17B, cross-sectional shapes of the openings 132 are straight shapes in which the diameters are approximately constant. However, other shapes may be used according to adjustment of the method of the laser irradiation, the wet etching, the electric discharge machining, or the like.

For example, the openings may be formed in drum shapes in which diameters of the center portions are decreased as shown in FIG. 2C, taper shapes in which the diameters are gradually decreased as shown in FIG. 2D, and uneven shapes in which the side surfaces of the diameter are uneven as shown in FIG. 2E.

Figure 17C:
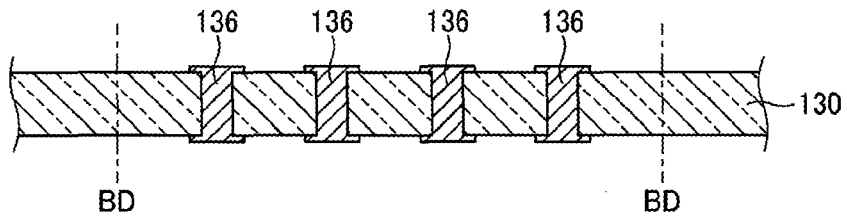

Subsequently, for example, conductive materials including copper are filled in the through-electrode openings 132 of the glass substrate 130, and thus, through-electrodes 136 are formed (FIG. 17C). As the method for filling the conductive materials into the openings 132 of the glass substrate 130, there is a plating method, a filling method, or the like, and the embedding may be performed by any method.

In addition, as shown in FIG. 17C, pads having lager diameters than those of the openings 132 are provided on both ends of through-electrodes 136. Moreover, a wiring layer (wiring pattern), which is connected to the through-electrodes 136, may be provided on one surface or both surfaces of the core substrate 130.

Figure 17D:
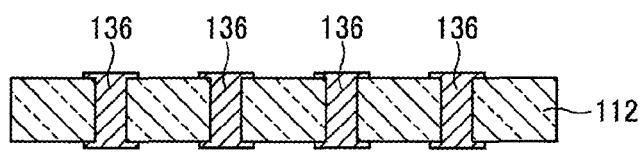

Subsequently, if the glass substrate 130, on which the through-electrodes 136 are formed, is cut along boundaries BD by the cutting device and is divided into a plurality of pieces, and the plurality of core substrates 112 are formed (FIG. 17D).

If the glass substrate 130 is cut by the cutting device, cracks are formed on the side surfaces of the core substrate 112. However, as shown in FIGS. 17C and 17D, since insulating layers or wiring layers are not formed on both surfaces of the glass substrate 130, shrinkage force or the like is not applied from the outside, and the core substrate 112 is not cracked.

Subsequently, in a state where the plurality of core substrates 112 formed as described above are arranged with predetermined intervals, all the core substrates are embedded with resins. A method of embedding the core substrate 112 with resins will be described.

Figure 18A:
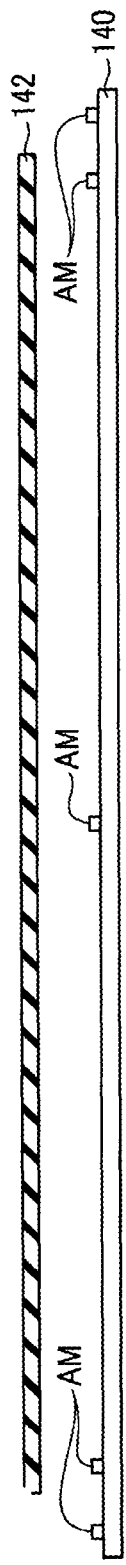
FIGS. 18A to 18C are process cross-sectional views showing the manufacturing method of the wiring substrate according to the second embodiment.
Figure 19:
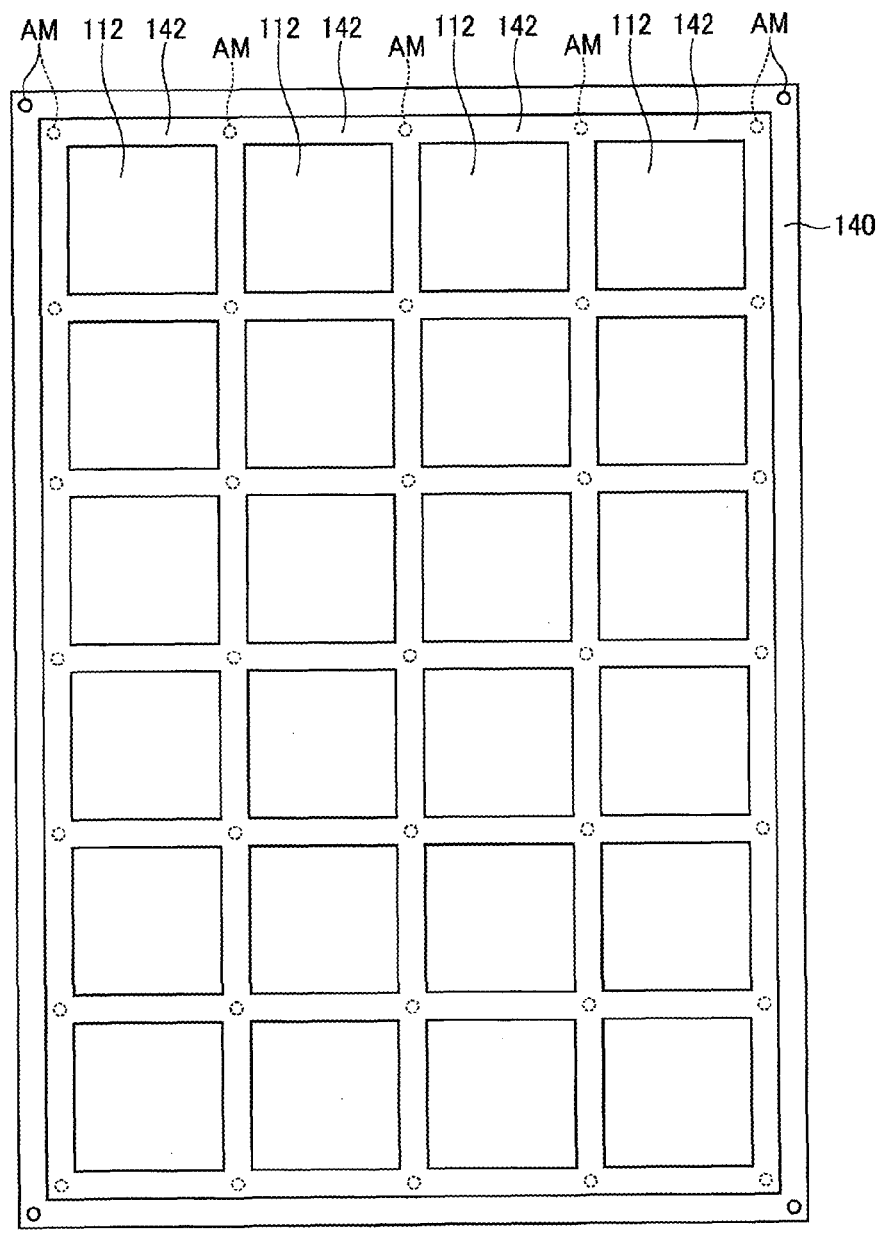
FIG. 19 is a plan view in a core substrate disposition process in the manufacturing method of the wiring substrate according to the second embodiment.

First, a support 140 which has sufficient dimensions for mounting the plurality of core substrates 112, and a resin film (insulating sheet) 142 for temporarily attaching to the plurality of core substrates 112 are prepared (FIG. 18A).

For example, the support 140 has a thickness of approximately 100 µm and is formed of copper. Predetermined alignment marks AM are formed on the support 140. By using the alignment marks AM, the resin film (insulating sheet) 142 can be disposed at a predetermined position, and the core substrate 112 can be arranged with predetermined intervals.

For example, the resin film (insulating sheet) 142 has a thickness of approximately 30 µm, and is formed of a thermosetting epoxy resin. The core substrate 112 can be temporarily fixed in a semi-cured state by the adhesive force of the resin film.

Figure 18B:
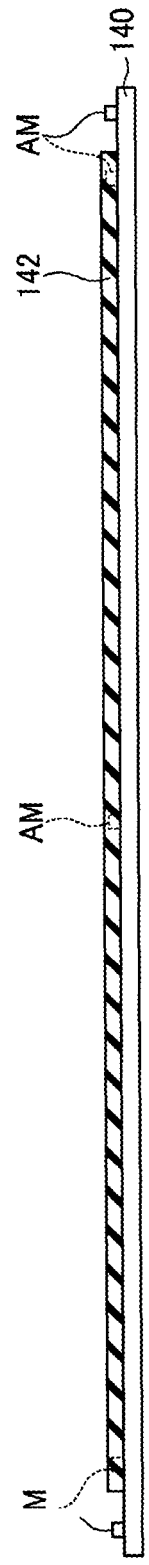

Subsequently, the resin film (insulating sheet) 142 is provided on the support 140 (FIG. 18B). The resin film 142 is fixed to the support 140 by the adhesive force of the resin film (insulating sheet) 142.

Figure 18C:
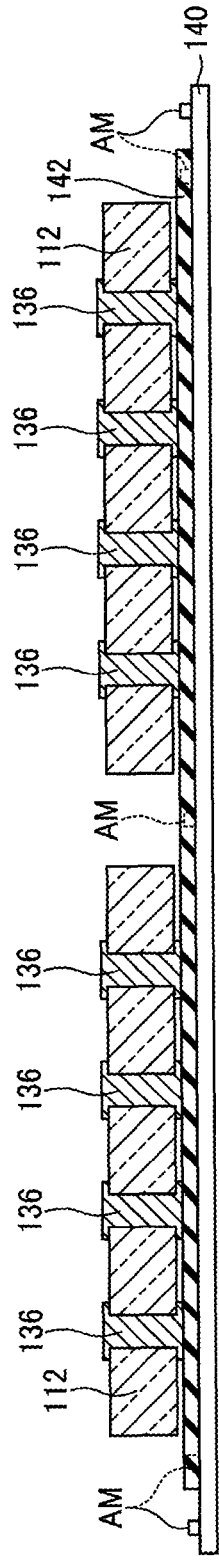

Subsequently, by using the alignment marks AM formed on the support 140, the plurality of core substrates 112 are arranged on the resin film (insulating plate) 142 at predetermined positions with predetermined intervals, and are temporarily attached to the resin film 142 (FIG. 18C). For example, the predetermined interval between the core substrates 112 is 600 μm.

FIG. 19 is a plan view in a state where the resin film (insulating plate) 142 is disposed on the support 140, and the plurality of core substrates 112 are disposed on the resin film (insulating plate) 142 and are temporarily attached to the resin film 142. The plurality of core substrates 112 are disposed on the resin film (insulating plate) 142 with predetermined intervals by using alignment marks AM of the support 140.

Subsequently, a resin film (insulating plate) 144 for covering the plurality of core substrates 112 from the upper portion is prepared (FIG. 20A). For example, the resin film (insulating plate) 144 has a thickness of approximately 600 μm and is formed of a semi-cured thermosetting resin. For example, the thermosetting resin is a thermosetting epoxy resin.

Subsequently, the resin film (insulating plate) 144 is attached onto the plurality of core substrates 112 (FIG. 20B).

Subsequently, if pressure is applied to all the core substrates by an air bag (not shown) while all the core substrates are heated in a vacuum chamber (not shown) of a vacuum laminator, the resin films (insulating plates) 142 and 144 closely contact both surfaces of the plurality of core substrates 112, and are filled between the plurality of core substrates 112.

Thereafter, the resin films 142 and 144 are cured completely by heating and become insulating layers 146. As a result, as shown in FIG. 20C, the insulating layers 146 are formed on both upper and lower surfaces of the plurality of core substrates 112, and an insulating material 146a is filled between the plurality of core substrates 112. The insulating layers 146 and the resin 146a are integrated to each other.

Subsequently, for example, the support 140 formed of copper is removed by etching (FIG. 21A).

Subsequently, openings 146b, which reach the through-electrodes 136, are formed in the insulating layers 146 formed on both surfaces of the plurality of core substrates 112 (FIG. 21B). For example, a method of forming the openings 146b on the insulating layers 146 is performed using laser.

Subsequently, for example, wiring layers 148 including copper are formed on the insulating layers 146 of both surfaces of the plurality of core substrates 112 (FIG. 21C). For example, a seed layer (not shown) is formed on the insulating layer 146, a photoresist layer (not shown) is formed on the seed layer, a predetermined patterning is performed on the photoresist layer, and the wiring layers 148 having predetermined patterns are formed by an electroplating method. Thereafter, the photoresistor layer is removed, and the seed layer is removed.

Subsequently, for example, resin films (not shown), which are formed of a semi-cured thermosetting resin, are attached to the wiring layers 148 of both surfaces of the plurality of core substrates 112 and are cured by heating, and thus, insulating layers 150 are formed (FIG. 22A). For example, the thermosetting resin is a thermosetting epoxy resin.

Subsequently, openings, which reach the wiring layers 148, are formed on the insulating layers 150 of both surfaces of the plurality of core substrates 112. For example, a method of forming the openings on the insulating layers 150 is performed using laser.

Subsequently, for example, wiring layers 152 including copper are formed on the insulating layers 150 of both surfaces of the plurality of core substrates 112 (FIG. 22A). For example, the wiring layers 152 are formed according to the method similar to the wiring layers 148.

Subsequently, insulating layers 154 are formed on the wiring layers 152 of both surfaces of the plurality of core substrates 112 (FIG. 22A). For example, the insulating layers 154 are formed according to the method similar to the insulating layers 150.

Subsequently, openings, which reach the wiring layers 152, are formed on the insulating layers 154 of both surfaces of the plurality of core substrates 112. For example, a method of forming the openings in the insulating layers 154 is performed using laser.

Subsequently, for example, wiring layers 156 including copper are formed on the insulating layers 154 of both surfaces of the plurality of core substrates 112 (FIG. 22A). For example, the wiring layers 156 are formed by the method similar to the wiring layers 148.

Subsequently, for example, photosensitive solder resist films (not shown), which are formed of an epoxy based resin, an acrylic resin, or the like, are attached to the wiring layers 156 of both surfaces of the plurality of core substrates 112, and thus, solder resist layers 158 are formed (FIG. 22A).

Subsequently, the solder resist layers 158 of the both surfaces of the plurality of core substrates 112 are exposed and developed in a predetermined pattern, and thus, openings 158a which reach the wiring layers 156 are formed (FIG. 22A).

Subsequently, bumps (connection terminals) 160 for connecting the semiconductor chip are formed on the wiring layers (electrode pads) 156 which are exposed from the openings 158a of the solder resist layer 158 of the upper surface side of the plurality of substrates 112 (FIG. 22B).

Subsequently, bumps (connection terminals) 162 for connecting another substrate are formed on the wiring layers (electrode pads) 156 which are exposed from openings 158a of the solder resist layer 158 of the lower surface side of the plurality of core substrates 112 (FIG. 22C).

For example, the bumps (connection terminals) 160 and the bumps (connection terminals) 162 are formed of solder.

Figure 23A:
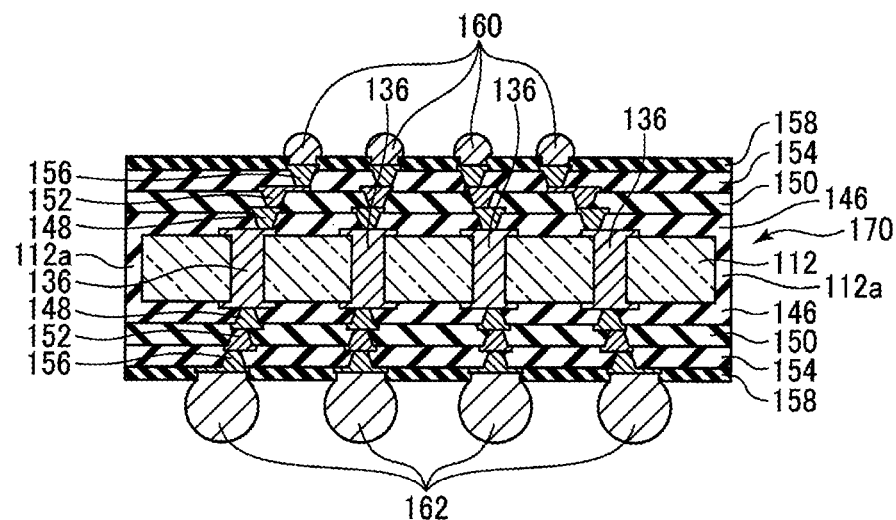
FIGS. 23A and 23B are process cross-sectional views showing the manufacturing method of the wiring substrate according to the second embodiment.
Figure 23B:
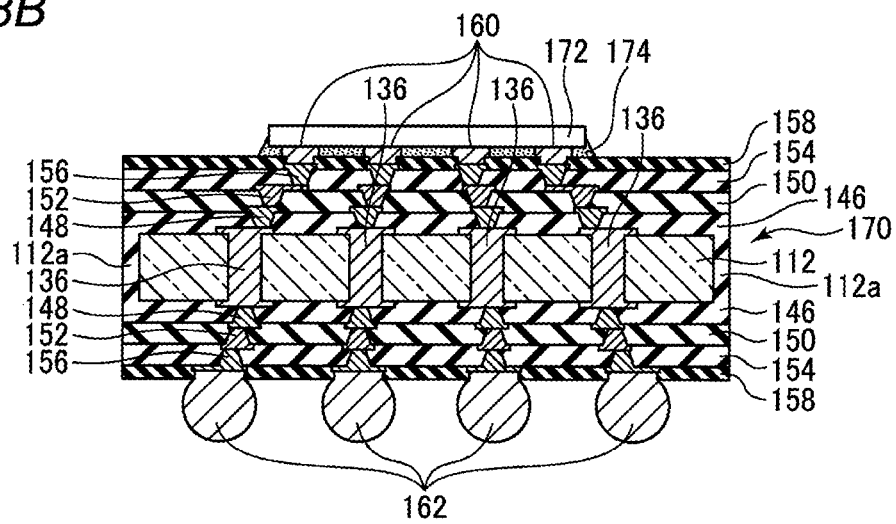

Subsequently, if a multilayered wiring structure shown in FIG. 22C is cut by a cutting device along boundaries BD and is divided into a plurality of pieces, a wiring substrate 170 shown in FIG. 23A is completed.

Subsequently, a semiconductor chip 172 is mounted on the upper side surface of the wiring substrate 170, and under-fill resin 174 is filled between the wiring substrate 170 and the semiconductor chip 172. The semiconductor chip 172 is electrically connected to the wiring substrate 170 through the bumps (connection terminals) 160.

In this way, according to the present embodiment, it is possible to manufacture the wiring substrate in which durability, production yield, productivity, or the like is improved.

(Modification Example of Method for Embedding Core Substrate with Resin)

In the embodiment, according to the method shown in FIGS. 18A to 20C, all core substrates 112 are embedded with resins in the state where the plurality of core substrates 112 are arranged with predetermined intervals, and the resins are filled between the plurality of core substrates 112. However, the present invention is not limited to this method, and other methods may be applied.

For example, the resin film (insulating sheet) is disposed on a support portion such as a placement stage without using the support, and the plurality of core substrates are disposed on the resin film (insulating sheet). The plurality of core substrates are covered with the resin film (resin sheet), and the resins are filled between the plurality of core substrates.

Modified Embodiment

The above-described embodiments are an example, and various modifications can be performed if necessary.

For example, in the above-described embodiments, the insulating layers and the wiring layers are formed on both surfaces of the core substrate, and thus, the wiring substrate is manufactured. However, the insulating layers and the wiring layers may be formed on only one surface of the core substrate. Moreover, the number of the insulating layers and the wiring layers, which are formed on the wiring substrate, is not limited to the number described in the above-described embodiments, and the number of the layers may not be limited.

Moreover, in the above-described embodiments, the bumps (connection terminals) are formed on the wiring substrate. However, the bumps may not be formed if necessary.

Various aspects of the subject-matter described herein are set out non-exhaustively in the following numbered clauses:

1. A method of manufacturing a wiring substrate, the method comprising:
    (a) providing a glass substrate comprising a plurality of core substrate areas each corresponding to one of core substrates;
    (b) forming a plurality of openings through the glass substrate along a boundary line between the respective core substrate areas;
    (c) filling a resin into the respective openings;
    (d) forming an insulating layer and a wiring layer on the glass substrate; and
    (e) dividing the glass substrate into a plurality of the core substrates by cutting the glass substrate along the boundary line, thereby obtaining a plurality of the wiring substrates.

2. The method according to clause 1,
    wherein the step (c) comprises:
    (c-1) providing a resin sheet on the glass substrate; and
    (c-2) pressing the resin sheet against the glass substrate so as to fill a portion of the resin sheet into the respective openings.

3. The method according to clause 2, wherein in the step (b), at least some of the openings are formed at respective cross points of the boundary line.

4. The method according to clause 3, wherein the step (b) comprises forming another openings through the glass substrate, and the step (c) comprises filling the resin into the respective another openings.

5. A method of manufacturing a wiring substrate comprising:
    (a) disposing a first resin sheet on a support;
    (b) disposing a plurality of core substrates on the first resin sheet with a certain interval, wherein the core substrates are made of glass;
    (c) covering the core substrates with a second resin sheet so as to fill gaps between the adjacent core substrates with a resin;
    (d) forming an insulating layer and a wiring layer on the core substrates;
    (e) cutting the resin filled in the gaps between the adjacent core substrates such that the core substrates are separated from each other, thereby obtaining a plurality of the wiring substrate.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring substrate comprising:
    a core substrate made of glass and comprising: a first surface; a second surface opposite to the first surface; and a side surface between the first surface and the second surface; and
    an insulating layer and a wiring layer, which are formed on at least one of the first surface and the second surface of the core substrate,
    wherein a plurality of concave portions are defined in the side surface of the core substrate, each of the plurality of concave portions continuously extending from the first surface to the second surface, and a resin is filled in each of the plurality of concave portions.

2. The wiring substrate according to claim 1, wherein a surface of the resin filled in the concave portions is substantially flush with the side surface of the core substrate.

3. The wiring substrate according to claim 1, wherein at least some of the concave portions are located at respective corners of the core substrate.

4. A wiring substrate comprising:
    a core substrate made of glass and comprising a first surface; a second surface opposite to the first surface; and a side surface between the first surface and the second surface; and
    an insulating layer and a wiring layer, which are formed on at least one of the first surface and the second surface of the core substrate,
    wherein the side surface of the core substrate is entirely covered with a resin, the resin projecting from the side surface of the core substrate and including an outer surface that is spaced from the side surface of the core substrate.

5. The wiring substrate according to claim 1,
    wherein the resin filled in the respective concave portions is integrally formed with the insulating layer.

6. The wiring substrate according to claim 4,
    wherein the resin entirely covering the side surface of the core substrate is integrally formed with the insulating layer.

7. The wiring substrate according to claim 1,
    wherein the insulating layer and the wiring layer are formed on both of the first surface and the second surface of the core substrate,
    wherein the insulating layer comprises: a first insulating layer on the first surface; and a second insulating layer on the second surface,
    wherein the wiring layer comprises: a first wiring layer on the first surface; and a second wiring layer on the second surface,
    wherein the resin filled in the respective concave portions is integrally formed with the first insulating layer and the second insulating layer.

8. The wiring substrate according to claim 4,
    wherein the insulating layer and the wiring layer are formed on both of the first surface and the second surface of the core substrate, wherein the insulating layer comprises: a first insulating layer on the first surface; and a second insulating layer on the second surface, wherein the wiring layer comprises: a first wiring layer on the first surface; and a second wiring layer on the second surface, wherein the resin entirely covering the side surface of the core substrate is integrally formed with the first insulating layer and the second insulating layer.

9. The wiring substrate according to claim 1, wherein the core substrate has an opening formed therethrough, and a resin is filled in the opening.

10. The wiring substrate according to claim 1, wherein the side surface of the core substrate defines at least a first portion of a side surface of the wiring substrate, and the resin defines at least a second portion of the side surface of the wiring substrate.

11. The wiring substrate according to claim 1, wherein each of the plurality of concave portions linearly extends along the side surface from the first surface to the second surface.

12. The wiring substrate according to claim 11, wherein each of the plurality of concave portions is defined in the first surface and the second surface.

13. A wiring substrate comprising:
a core substrate made of glass and comprising: a first surface; a second surface opposite to the first surface; and a side surface between the first surface and the second surface; and an insulating layer and a wiring layer, which are formed on at least one of the first surface and the second surface of the core substrate, wherein a plurality of concave portions are defined in the side surface of the core substrate, each of the plurality of concave portions extending from the first surface to the second surface, and a resin is filled in each of the plurality of concave portions, and wherein each of the plurality of concave portions is defined in the first surface and the second surface.

14. The wiring substrate according to claim 4, wherein a thickness of the resin covering the side surface of the core substrate is between 20 µm to 200 µm, and the outer surface of the resin is spaced between 20 µm to 200 µm from the side surface of the core substrate.

15. The wiring substrate according to claim 4, wherein side surfaces of the insulating layer are flush with side surfaces of the resin covering the side surface of the core substrate.

16. The wiring substrate according to claim 15, wherein a thickness of the resin covering the side surface of the core substrate is between 20 µm to 200 µm, and the outer surface of the resin is spaced between 20 µm to 200 µm from the side surface of the core substrate.

* * * * *